United States Patent
Nakao et al.

(10) Patent No.: US 10,677,442 B2
(45) Date of Patent: Jun. 9, 2020

(54) LIGHT EMITTING APPARATUS, ELECTRONIC DEVICE, ILLUMINATION APPARATUS AND VEHICLE HEADLAMP

(71) Applicant: Mitsubishi Electric Corporation, Chiyoda-ku, Tokyo (JP)

(72) Inventors: Takayuki Nakao, Tokyo (JP); Naoki Sawai, Tokyo (JP)

(73) Assignee: MITSUBISHI ELECTRIC CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 16/349,094

(22) PCT Filed: Nov. 16, 2017

(86) PCT No.: PCT/JP2017/041276
§ 371 (c)(1),
(2) Date: May 10, 2019

(87) PCT Pub. No.: WO2018/092846
PCT Pub. Date: May 24, 2018

(65) Prior Publication Data
US 2019/0277486 A1  Sep. 12, 2019

(30) Foreign Application Priority Data
Nov. 17, 2016 (JP) .................. 2016-224212

(51) Int. Cl.
*F21K 9/64* (2016.01)
*F21V 29/58* (2015.01)
(Continued)

(52) U.S. Cl.
CPC ................ *F21V 29/58* (2015.01); *F21K 9/64* (2016.08); *F21V 15/01* (2013.01); *F21V 29/502* (2015.01);
(Continued)

(58) Field of Classification Search
CPC ........ F21V 29/58; F21V 29/502; F21V 29/56; F21V 29/59; G03B 21/14; G03B 21/204; G03B 21/2033; G03B 21/16
(Continued)

(56) References Cited

U.S. PATENT DOCUMENTS

2005/0168990 A1* 8/2005 Nagata ................. F21V 29/30
362/294
2013/0335989 A1* 12/2013 Sato .................... B60Q 1/04
362/510
(Continued)

FOREIGN PATENT DOCUMENTS

JP  2003295319 A  10/2003
JP  2011075657 A  4/2011
(Continued)

OTHER PUBLICATIONS

International Search Report (PCT/ISA/210) dated Dec. 26, 2017, by the Japan Patent Office as the International Searching Authority for International Application No. PCT/JP2017/041276.
(Continued)

*Primary Examiner* — Christopher M Raabe
(74) *Attorney, Agent, or Firm* — Buchanan Ingersoll & Rooney PC

(57) ABSTRACT

A highly reliable light emitting apparatus which emits light with high efficiency is obtained. The light emitting apparatus includes a light emitting member, a refrigerant, and a housing. The light emitting member includes a first surface including a phosphor irradiated with light to emit light, and a second surface different from the first surface. The refrigerant cools the light emitting member. The housing includes a holding portion for holding the refrigerant. A surface of the housing is provided with an opening communicating with the holding portion. The light emitting member is connected
(Continued)

to the housing such that the second surface closes the opening.

19 Claims, 15 Drawing Sheets

(51) Int. Cl.
    *F21V 15/01* (2006.01)
    *G03B 21/16* (2006.01)
    *G03B 21/14* (2006.01)
    *F21V 29/502* (2015.01)
    *F21V 29/56* (2015.01)
    *F21V 29/76* (2015.01)
    *H05K 7/20* (2006.01)
    *F21V 29/77* (2015.01)

(52) U.S. Cl.
    CPC .............. *F21V 29/56* (2015.01); *F21V 29/59* (2015.01); *F21V 29/76* (2015.01); *F21V 29/77* (2015.01); *G03B 21/14* (2013.01); *G03B 21/16* (2013.01); *H05K 7/20* (2013.01)

(58) Field of Classification Search
    USPC ........................................................ 362/294
    See application file for complete search history.

(56) References Cited

U.S. PATENT DOCUMENTS

| 2014/0022512 | A1* | 1/2014 | Li ............................. F21V 9/00 |
| | | | 353/31 |
| 2016/0026074 | A1* | 1/2016 | Adema .................. G02B 7/008 |
| | | | 362/84 |
| 2016/0161736 | A1* | 6/2016 | Chou .................. G02B 26/008 |
| | | | 362/324 |
| 2018/0095348 | A1* | 4/2018 | Asano .................... G03B 21/16 |
| 2018/0356715 | A1* | 12/2018 | Kobayashi ........... H04N 9/3144 |
| 2019/0146314 | A1* | 5/2019 | Yoshikawa ............ G03B 21/16 |
| | | | 362/84 |

FOREIGN PATENT DOCUMENTS

| JP | 2011077056 A | 4/2011 |
| JP | 2011186350 A | 9/2011 |
| JP | 2015032599 A | 2/2015 |
| JP | 2015184434 A | 10/2015 |

OTHER PUBLICATIONS

Written Opinion (PCT/ISA/237) dated Dec. 26, 2017, by the Japan Patent Office as the International Searching Authority for International Application No. PCT/JP2017/041276.
Chinese Office Action dated Mar. 27, 2020 issued in corresponding Chinese Patent Application No. 201780069558.7, with English translation (21 pages).

* cited by examiner

LIGHT EMITTING APPARATUS, ELECTRONIC DEVICE, ILLUMINATION APPARATUS AND VEHICLE HEADLAMP

TECHNICAL FIELD

The present invention relates to a light emitting apparatus, an electronic device, an illumination apparatus and a vehicle headlamp, and more particularly to a light emitting apparatus, an electronic device, an illumination apparatus and a vehicle headlamp using a phosphor.

BACKGROUND ART

A light emitting apparatus that applies light to a light emitting member including a phosphor to obtain fluorescence emission is conventionally known. Japanese Patent Laying-Open No. 2011-077056, for example, discloses a light emitting apparatus in which a phosphor is applied in the vicinity of a circumferential portion of a disc which is then rotated, and blue light is applied thereto to obtain fluorescence emission. Japanese Patent Laying-Open No. 2003-295319 discloses a light emitting apparatus in which laser light is collected and applied to a phosphor disposed on the focal point of a reflector having a parabolic reflecting surface, and light emitted from the phosphor is reflected from the reflector to emit light in a desired direction.

CITATION LIST

Patent Literature

PTL 1: Japanese Patent Laying-Open No. 2011-077056
PTL 2: Japanese Patent Laying-Open No. 2003-295319

SUMMARY OF INVENTION

Technical Problem

In the light emitting apparatuses described above, excitation light from a light source such as a laser light source is focused on a phosphor, causing the phosphor to emit light. In such a light emitting apparatus, local heat generation occurs due to the excitation light being focused and applied to the phosphor, resulting in difficulty in cooling the phosphor.

In the light emitting apparatus disclosed in PTL 1, the disc is rotated at high speed in order to suppress heat generation caused by the focusing of light on the phosphor. However, the light emitting apparatus having such a configuration also needs a motor for rotating the disc, a power supply circuit associated therewith, and the like. Thus, such a light emitting apparatus has a large number of components and a complicated structure. Moreover, noise occurs during the rotation of the disc. In addition, the components such as a motor described above have limited life spans, which limit the life span of the light emitting apparatus even if the reliability of a light emitting member such as the phosphor is improved.

The light emitting apparatus disclosed in PTL 2 has a structure of collecting laser light on the phosphor, but has difficulty in cooling the phosphor. Thus, efficiency degradation called temperature quenching occurs due to an increase in temperature of the phosphor.

The present invention has been made to solve the problems as described above, and aims to obtain a highly reliable light emitting apparatus which emits light with high efficiency by dissipating heat, which was generated by focusing of light on a phosphor, through a simple structure. The present invention also aims to obtain a highly efficient and long-life electronic device including the light emitting apparatus described above. The present invention also aims to obtain highly efficient and long-life illumination apparatus and vehicle headlamp including the light emitting apparatus described above.

Solution to Problem

A light emitting apparatus according to the present disclosure includes a light emitting member, a refrigerant, and a housing. The light emitting member includes a first surface including a phosphor irradiated with light to emit light, and a second surface different from the first surface. The refrigerant cools the light emitting member. The housing includes a holding portion for holding the refrigerant. A surface of the housing is provided with an opening communicating with the holding portion. The light emitting member is connected to the housing such that the second surface closes the opening.

An electronic device according to the present disclosure includes the light emitting apparatus described above and a light source. The light source applies light to the first surface of the light emitting member in the light emitting apparatus.

Advantageous Effects of Invention

According to the above, light can be applied to the first surface of the light emitting member to cause the phosphor to emit light, while the refrigerant held in the holding portion can cool the light emitting member from the second surface side through the opening. Accordingly, a highly reliable light emitting apparatus which emits light with high efficiency by dissipating heat, which was generated by focusing of light on the phosphor, through a simple structure can be obtained. In addition, the need for a complicated cooling structure as illustrated in PTL 1 is eliminated, so that a highly reliable light emitting apparatus applicable to an illumination apparatus for a vehicle such as a headlamp or an illumination apparatus such as an outdoor spotlight can be realized.

DESCRIPTION OF EMBODIMENTS

Figure 1:
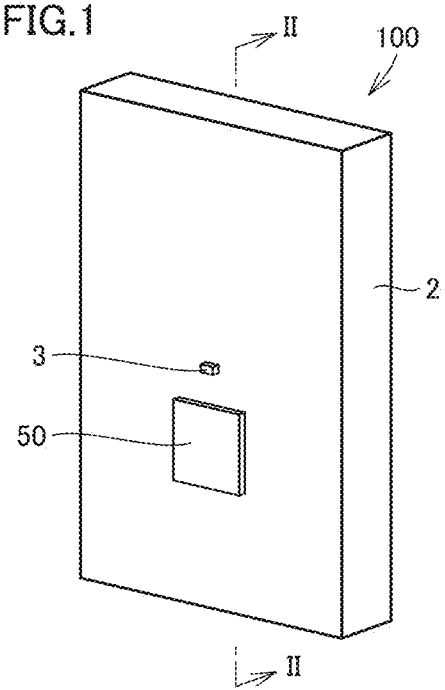
FIG. 1 is a schematic perspective view of a light emitting apparatus according to Embodiment 1 of the present invention.

In the following, embodiments of the present invention will be described in detail with reference to the drawings. Although a plurality of embodiments are described below, configurations described in the respective embodiments are intended to be combined as appropriate from the beginning. The same or corresponding parts in the drawings are designated by the same characters and will not be described repeatedly.

Embodiment 1

<Configuration of Light Emitting Apparatus>

Figure 2:
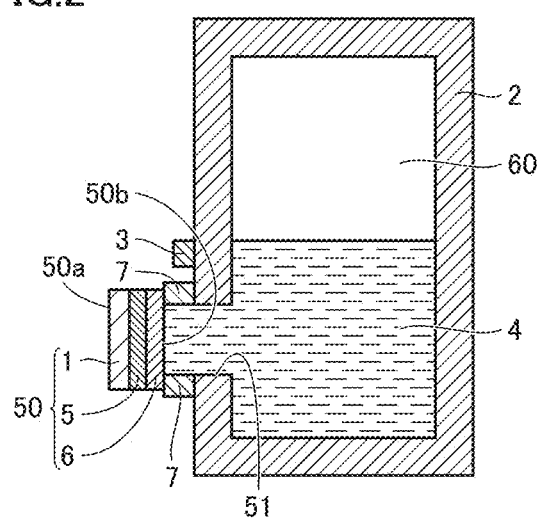
FIG. 2 is a schematic cross-sectional view taken along the line II-II in FIG. 1.

FIG. 1 is a schematic perspective view of a light emitting apparatus according to Embodiment 1 of the present invention. FIG. 2 is a schematic cross-sectional view of the light emitting apparatus taken along the line II-II in FIG. 1.

As shown in FIGS. 1 and 2, a light emitting apparatus 100 mainly includes a light emitting member 50 having a light emitting plate 1, a coolant-sealed portion 2 as a housing, a coolant 4 as a refrigerant, and a temperature sensor 3. The inside of coolant-sealed portion 2 is a holding portion 60 for holding the coolant. Stated from a different perspective, light emitting apparatus 100 includes light emitting member 50, coolant 4 as a refrigerant, and coolant-sealed portion 2 as a housing. Light emitting member 50 includes a first surface 50a including a phosphor irradiated with light to emit light, and a second surface 50b different from this first surface 50a. Coolant 4 cools light emitting member 50. Coolant-sealed portion 2 includes holding portion 60 for holding coolant 4. A surface of coolant-sealed portion 2 is provided with an opening 51 communicating with holding portion 60. Light emitting member 50 is connected to coolant-sealed portion 2 such that second surface 50b closes opening 51.

Light emitting member 50 mainly includes light emitting plate 1, a reflective layer 5 and a metal layer 6. Light emitting plate 1 is made by mixing a phosphor, which receives excitation light from a light emitting layer and emits light of a different wavelength, with an inorganic material such as ceramics or glass, and curing the mixture. This light emitting plate 1 includes a front surface as a first surface, and a rear surface located opposite to this front surface. The rear surface of light emitting plate 1 is provided with reflective layer 5 for reflecting light, and a layer (not shown) for protecting reflective layer 5. As reflective layer 5, a layer of any material can be used as long as the layer is made of a material of high reflectivity. As reflective layer 5, for example, white metal foil of high reflectivity bonded to light emitting plate 1, or a deposited layer made by depositing silver, aluminum or the like on the rear surface of light emitting plate 1 can be used.

Further, metal layer 6 constituting second surface 50b which is a rear surface of light emitting member 50 is formed on reflective layer 5. Metal layer 6 is provided to facilitate joining of coolant-sealed portion 2 and light emitting member 50. Light emitting member 50 is connected to coolant-sealed portion 2 by a joining member 7 made of a metal material. Light emitting member 50 and coolant-sealed portion 2 are joined to each other by brazing or soldering, for example. In other words, joining member 7 joins a portion of metal layer 6 of light emitting member 50 to a region of the surface of coolant-sealed portion 2 as a housing that surrounds opening 51. Metal layer 6 and reflective layer 5 may be made of the same material. Joining member 7 may be an adhesive made of resin.

Water, ethanol, ethylene glycol, a fluorine-based solution, or a mixture thereof can be used as coolant 4. Coolant 4 is sealed in holding portion 60 of coolant-sealed portion 2. Coolant 4 is disposed within holding portion 60 so as to cover opening 51 and to reach a region located higher than opening 51 in the vertical direction in holding portion 60.

This holding portion 60 which is the internal space of coolant-sealed portion 2 is provided with a space for pressure regulation. Inert gas such as nitrogen gas is sealed in this space. In other words, the inside of holding portion 60 is formed of a portion filled with coolant 4, and a portion in which the inert gas is sealed. The first surface of light emitting member 50, which is a light emitting surface of light emitting plate 1, is located outside light emitting apparatus 100. The second surface side which is the rear surface of light emitting member 50, that is, a surface of metal layer 6, is disposed to be in direct contact with coolant 4 through opening 51. In other words, light emitting member 50 is attached to close opening 51 in coolant-sealed portion 2.

Temperature sensor 3 is mounted on coolant-sealed portion 2. Temperature sensor 3 is disposed at a position adjacent to opening 51. Stated from a different perspective, temperature sensor 3 is disposed to be aligned with opening 51 in the direction of gravity.

<Operation of Light Emitting Apparatus>

In light emitting apparatus 100, first surface 50a of light emitting member 50 is irradiated with excitation light such as laser light, causing emission of light generated by fluorescence emission. Here, the temperature of light emitting member 50 increases by the irradiation of light. Such heat of light emitting member 50 is transferred to coolant 4. From coolant 4, the heat is released to the outside through a wall surface of coolant-sealed portion 2. As a result, the temperature increase in light emitting member 50 can be suppressed.

<Configuration and Operation of Portion of Electronic Device Where Light Emitting Apparatus is Mounted>

Figure 3:
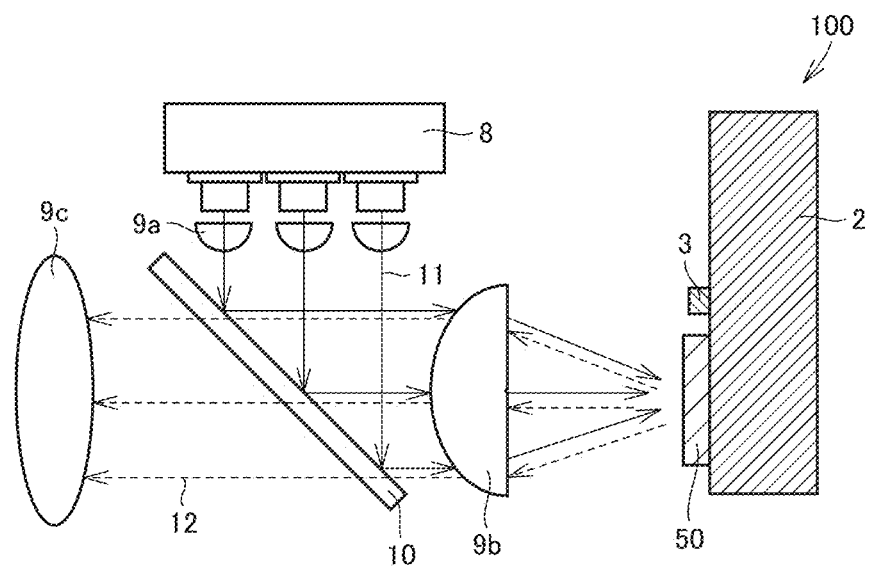
FIG. 3 is a schematic partial view of an electronic device in an example where the light emitting apparatus shown in FIG. 1 is mounted on the electronic device.
Figure 4:
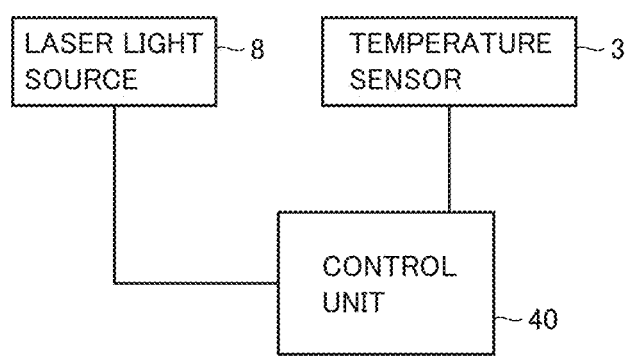
FIG. 4 is a block diagram illustrating control of the light emitting apparatus in the electronic device shown in FIG. 3.

FIG. 3 is a schematic partial view showing a configuration example where the light emitting apparatus according to Embodiment 1 of the present invention is mounted on an electronic device such as a vehicle headlamp, a projector or an illumination apparatus. FIG. 4 is a block diagram illustrating control of the light emitting apparatus in the electronic device shown in FIG. 3.

The electronic device shown in FIGS. 3 and 4 mainly includes a laser light source 8, lenses 9a to 9c, a dichroic mirror 10, and light emitting apparatus 100 described above. In the electronic device, disposed in the vicinity of laser light source 8 having a plurality of light emission points is lens 9a for collimating rays of light from these light emission points. Dichroic mirror 10 is disposed across lens 9a from laser light source 8. Dichroic mirror 10 is a mirror for selectively reflecting only the wavelength range of the laser light serving as the excitation light. Lens 9b is disposed in the vicinity of light emitting apparatus 100. Lens 9b has the function of collecting the laser light as the excitation light, which was reflected from dichroic mirror 10, on light emitting member 50. Lens 9b also has the function of directing the light generated by the fluorescence emission at light emitting member 50 to an outgoing direction. Lens 9c is disposed across dichroic mirror 10 from lens 9b.

In the electronic device having a configuration as described above, rays of laser light generated from laser light source 8 are emitted in the same direction by lens 9a, as illustrated by a light path 11 indicated by solid lines in FIG. 3, and reflected from dichroic mirror 10. The reflected excitation light, which is laser light of a prescribed wavelength range, is collected by lens 9b on the surface of light emitting member 50. On the surface of light emitting member 50, light of a longer wavelength (hereinafter also called as outgoing light) than the excitation light is generated by fluorescence emission from the phosphor included in light emitting plate 1 (see FIG. 2). This outgoing light returns to dichroic mirror 10 again through lens 9b, as illustrated by a light path 12 for fluorescence emission indicated by dotted lines in FIG. 3. Here, the outgoing light has a different wavelength than the excitation light, and thus passes through dichroic mirror 10 and travels straight. Subsequently, this outgoing light enters lens 9c.

In this manner, the excitation light by laser light source 8 is converted in wavelength by light emitting member 50 and applied to the outside as outgoing light. The wavelength of the outgoing light can be changed by adjustment of the type or composition of the phosphor included in light emitting plate 1 of light emitting member 50 (see FIG. 3). In this manner, green light can be generated, whose high efficiency is difficult to achieve by an LED, a semiconductor laser light source or the like, and light having a spectrum close to that of natural light can be generated.

When the phosphor of light emitting member 50 is irradiated with excitation light, the temperature of a portion irradiated with the excitation light increases due to heat generation caused by a loss that occurs because of an energy difference between the excitation light and fluorescent light, or due to light absorption into the material itself. Heat generated at the irradiated portion is conducted to the rear surface of light emitting member 50, causing an increase in temperature of coolant 4 in direct contact with this rear surface. As a result of this temperature increase, convection occurs in coolant 4 within holding portion 60, causing new coolant 4 to be in contact with this rear surface. The heat is further transferred from the rear surface of light emitting member 50 to this new coolant 4. Such a phenomenon repeats itself, thus allowing a reduction in temperature of the rear surface of light emitting member 50. Moreover, as the temperature of light emitting member 50 keeps increasing and reaches a temperature equal to or higher than a certain temperature, the temperature of coolant 4 in contact with the rear surface of light emitting member 50 reaches the boiling point of this coolant 4, causing generation of bubbles in the vicinity of the rear surface. The generated bubbles move in a direction opposite to the direction of gravity, thus facilitating the convection of coolant 4. Gas collects in an upper space of holding portion 60 of coolant-sealed portion 2, and this gas is cooled by heat exchange with the outside through a wall portion of coolant-sealed portion 2. As a result, the vaporized coolant is liquefied. Coolant 4 cooled and liquefied in an upper portion of holding portion 60 in this manner serves as a refrigerant for cooling light emitting member 50 again.

The operation as described above maintains the rear surface of light emitting member 50 at a temperature close to the boiling point of coolant 4. As the amount of the excitation light applied to light emitting member 50 is increased, coolant 4 also boils faster, but the convection of coolant 4 is also facilitated, so that the temperature increase in light emitting member 50 can be suppressed. The temperature of coolant 4 does not exceed the boiling point while coolant 4 is being supplied to the rear surface of light emitting member 50 by this convection. Thus, when the amount of the excitation light is increased, the temperature increase in light emitting member 50 is maintained within a certain range in the vicinity of the boiling point of coolant 4. For example, water is used for coolant 4, and the pressure in holding portion 60 which is the inside of coolant-sealed portion 2 is reduced in advance. In this case, the boiling point of water when the internal pressure of holding portion 60 of coolant-sealed portion 2 has reached 0.1 MPa during heating is 100° C. Accordingly, the temperature of light emitting member 50 is expressed as (amount of heat generation)×(thermal resistance between light emitting member 50 and coolant 4), and the surface temperature of the rear surface of light emitting member 50 is maintained in the vicinity of 100° C. as long as coolant 4 is present at the rear surface. By regulating the pressure during this pressure reduction, a light emitting apparatus having a temperature that will prevent damage to light emitting plate 1 can be designed.

When the amount of the excitation light is further increased and a boiling phenomenon of coolant 4 makes a transition from a nucleate boiling state to a film boiling state, coolant 4 in direct contact with second surface 50b which is the rear surface of light emitting member 50 (see FIG. 2) is lost, causing a quick increase in temperature of light emitting member 50. For this reason, light emitting apparatus 100 described above has temperature sensor 3 attached thereon, to allow measurement of the temperature of coolant-sealed portion 2. In this case, by reducing the amount of the excitation light or stopping the light irradiation once the temperature of coolant-sealed portion 2 has reached a certain value, the quick increase in temperature of light emitting member 50 as described above can be suppressed.

Such control can be implemented by the electronic device including a control unit 40 connected to temperature sensor 3 of light emitting apparatus 100 and to laser light source 8 as shown in FIG. 4, for example. Specifically, temperature measurement data from temperature sensor 3 is input to control unit 40 (measurement step). Then, it is determined at control unit 40 whether or not the temperature measurement data that was input at the measurement step has exceeded a reference value (determination step). When it is determined in this determination step that the temperature measurement data has not exceeded the reference value, the measurement step and the determination step described above are repeated again at regular intervals. When it is determined in the determination step that the temperature measurement data has exceeded the reference value, on the other hand, control is performed such as reducing the amount of light from laser light source 8, or stopping oscillation of the laser light from laser light source 8.

<Function and Effect of Light Emitting Apparatus>

In light emitting apparatus 100 described above, coolant 4 as a refrigerant can make direct contact with the rear surface which is second surface 50b of light emitting member 50, to cool this light emitting member 50. Specifically, the temperature of light emitting member 50 can be maintained in the vicinity of the boiling point of coolant 4, for example, to suppress overheating of light emitting member 50, thereby ensuring the reliability of light emitting apparatus 100.

In light emitting apparatus 100 described above, light emitting member 50 includes metal layer 6 constituting second surface 50b, as shown in FIG. 2. Light emitting apparatus 100 further includes joining member 7. Joining member 7 joins a portion of metal layer 6 of light emitting member 50 to a region of the surface of coolant-sealed portion 2 as a housing that surrounds opening 51. In this case, a portion of second surface 50b of light emitting member 50 is joined by joining member 7 to a region of coolant-sealed portion 2 that surrounds opening 51, so that leakage of coolant 4 at the joint of light emitting member 50 and coolant-sealed portion 2 can be suppressed.

In the light emitting apparatus described above, coolant 4 is disposed within holding portion 60 so as to cover opening 51 and to reach a region located higher than opening 51 in the direction of gravity in holding portion 60, as shown in FIG. 2. In other words, the liquid level of coolant 4 is at a position sufficiently higher than opening 51. Thus, when the temperature of the rear surface which is second surface 50b of light emitting member 50 is increased, and the coolant boils and volatilizes in the vicinity of this second surface 50b, a sufficient amount of new coolant 4 can be supplied to second surface 50b of light emitting member 50. Therefore, heat generated from the irradiated portion (also called a light-collected portion) of light emitting member 50 that is irradiated with laser light and the like can be reliably transferred to coolant 4 through second surface 50b. In other words, the loss of coolant 4 in contact with second surface 50b can be suppressed during ebullient cooling of light emitting member 50 by coolant 4, thus allowing stable cooling of light emitting member 50.

Light emitting apparatus 100 described above includes temperature sensor 3 mounted on coolant-sealed portion 2 as shown in FIG. 1. Temperature sensor 3 is disposed at a position adjacent to opening 51. Stated from a different perspective, temperature sensor 3 is disposed to be aligned with opening 51 in the direction of gravity. In other words, temperature sensor 3 is attached in the vicinity of light emitting member 50. In this case, a boiling state of coolant 4 within holding portion 60 of coolant-sealed portion 2 can be detected. Thus, the loss of coolant 4 in contact with the rear surface which is second surface 50b of light emitting member 50 can be suppressed during ebullient cooling of light emitting member 50 by coolant 4, thus allowing stable cooling of light emitting member 50.

<Configuration as well as Function and Effect of First Modification of Light Emitting Apparatus>

Figure 5:
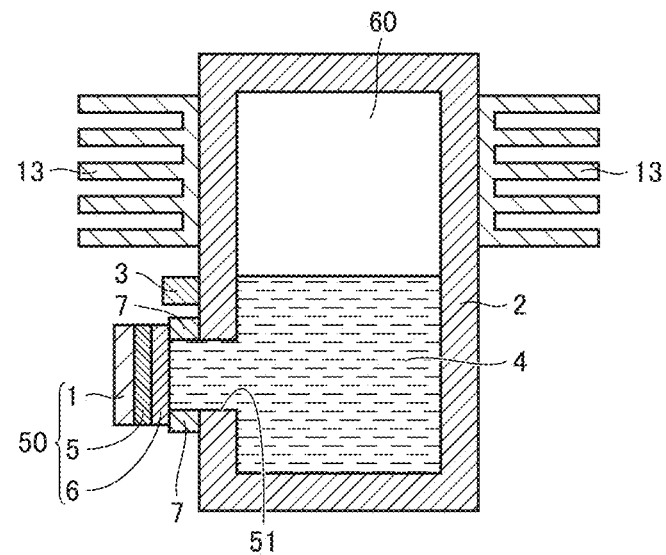
FIG. 5 is a schematic cross-sectional view of a light emitting apparatus according to a first modification of Embodiment 1 of the present invention.

FIG. 5 is a schematic cross-sectional view of a light emitting apparatus according to a first modification of Embodiment 1 of the present invention. The light emitting apparatus shown in FIG. 5 basically has a similar configuration to light emitting apparatus 100 shown in FIGS. 1 and 2, but is different from light emitting apparatus 100 shown in FIGS. 1 and 2 in that it includes heat dissipating fins 13, which are an example of a heat dissipation member, outside coolant-sealed portion 2. Instead of heat dissipating fins 13, a heat dissipation member having another configuration may be connected to an outer peripheral surface of coolant-sealed portion 2.

The light emitting apparatus having such a configuration can also obtain similar effects to those of the light emitting apparatus shown in FIGS. 1 and 2. Moreover, by connecting the heat dissipation member as exemplified by heat dissipating fins 13 to the outer periphery of coolant-sealed portion 2, the heat of coolant 4 can be efficiently released to the outside through the wall portion of coolant-sealed portion 2 and these heat dissipating fins 13. Thus, the temperature increase in coolant 4 can be suppressed, to increase the efficiency of cooling light emitting member 50.

<Configuration as well as Function and Effect of Second Modification of Light Emitting Apparatus>

Figure 6:
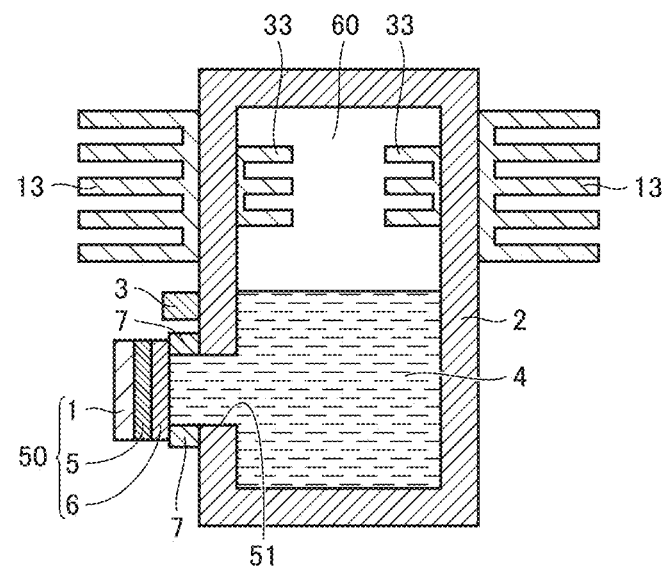
FIG. 6 is a schematic cross-sectional view of a light emitting apparatus according to a second modification of Embodiment 1 of the present invention.

FIG. 6 is a schematic cross-sectional view of a light emitting apparatus according to a second modification of Embodiment 1 of the present invention. The light emitting apparatus shown in FIG. 6 basically has a similar configuration to the light emitting apparatus shown in FIG. 5, but is different from the light emitting apparatus shown in FIG. 5 in that it includes fins 33, which are an example of a heat dissipation member connected to an inner wall surface of holding portion 60 of coolant-sealed portion 2. Instead of fins 33, a heat transfer member having another configuration may be connected to the inner wall surface of holding portion 60.

The light emitting apparatus having such a configuration can also obtain similar effects to those of the light emitting apparatus shown in FIG. 5. Moreover, by connecting the heat transfer member as exemplified by fins 33 to the inner wall surface of holding portion 60 of coolant-sealed portion 2, the area of contact between coolant 4 or the gas within holding portion 60 and coolant-sealed portion 2 can be increased. Accordingly, the heat of coolant 4 can be efficiently released to the outside through fins 33, the wall portion of coolant-sealed portion 2, and heat dissipating fins 13. Thus, the temperature increase in coolant 4 can be suppressed, to increase the efficiency of cooling light emitting member 50.

The light emitting apparatus may be provided with a plurality of light emitting members 50. For example, a plurality of light emitting members 50 may be prepared, coolant-sealed portion 2 may be provided with a plurality of openings 51, and the plurality of light emitting members 50 may be disposed to close these openings 51. Here, light emitting members 50 including different types of phosphors may be mounted on the light emitting apparatus. By so doing, different fluorescent colors can be generated from the plurality of light emitting members 50. In other words, a light emitting apparatus capable of emitting a plurality of luminescent colors can be realized.

At light emitting plate 1 of light emitting member 50, the phosphor may be disposed on first surface 50a in such a manner as to draw a figure such as a circle or a quadrangle. The shape of the light emitting portion can be adjusted by such adjustment of the disposition of the phosphor.

Embodiment 2

<Configuration of Light Emitting Apparatus>

Figure 7:
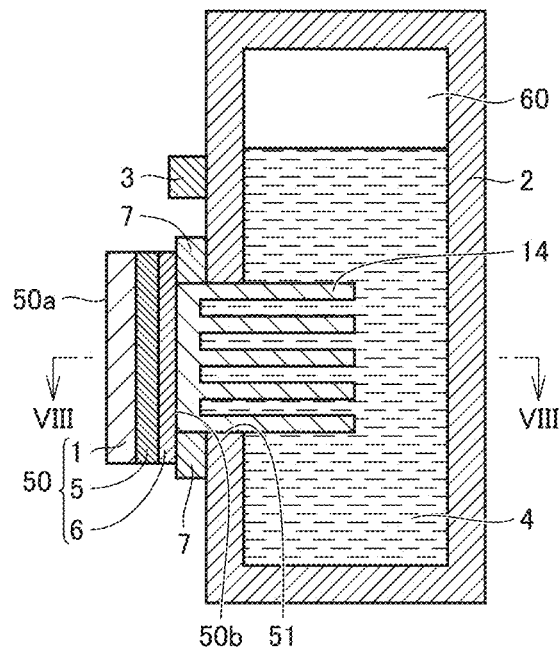
FIG. 7 is a schematic cross-sectional view of a light emitting apparatus according to Embodiment 2 of the present invention.
Figure 8:
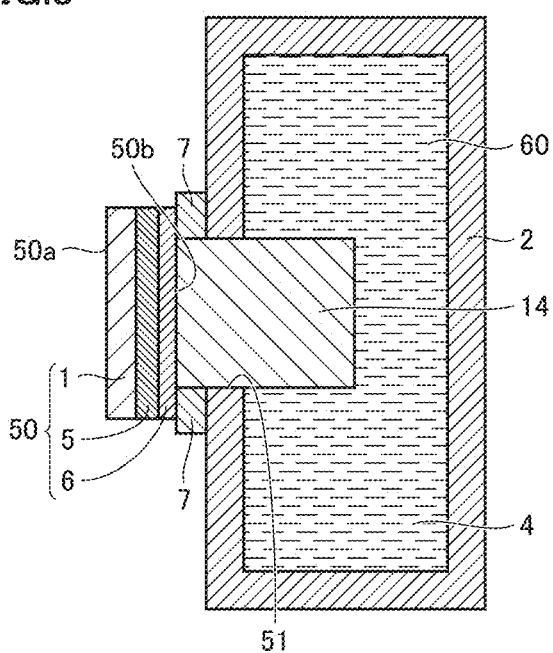
FIG. 8 is a schematic cross-sectional view taken along the line VIII-VIII in FIG. 7.

FIG. 7 is a schematic cross-sectional view of a light emitting apparatus according to Embodiment 2 of the present invention. FIG. 8 is a schematic cross-sectional view taken along the line VIII-VIII in FIG. 7.

The light emitting apparatus shown in FIGS. 7 and 8 basically has a similar configuration to light emitting apparatus 100 shown in FIGS. 1 and 2, but is different from the light emitting apparatus shown in FIGS. 1 and 2 in that it includes a first heat dissipation member 14. First heat dissipation member 14 is connected to second surface 50b which is the rear surface of light emitting member 50, and protrudes into holding portion 60 through opening 51 to be in contact with coolant 4 as a refrigerant. First heat dissipation member 14 includes a fin structure as a first protrusion-recess structure portion located within holding portion 60. A plurality of fins constituting the fin structure are disposed such that their main surfaces having a relatively large surface area extend in the horizontal direction perpendicular to the direction of gravity. Coolant 4 fills holding portion 60 so as to be in contact with the fin structure of first heat dissipation member 14 at all times.

First heat dissipation member 14 may be made of any material, and may be formed of, for example, metal such as copper or aluminum, or a ceramics material such as silicon nitride. First heat dissipation member 14 is attached to second surface 50b of light emitting member 50 with an adhesive, for example. It is desirable to use a thermally conductive adhesive as this adhesive. Instead of the method using an adhesive as described above, any method can be used to fix first heat dissipation member 14 to light emitting member 50. For example, one of light emitting member 50 and first heat dissipation member 14 may be provided with a thread groove portion and the other may be provided with a screw thread portion, and this screw thread portion may be screwed into the thread groove portion to form a connection by a thread structure.

Although first heat dissipation member 14 may be prepared as a separate member from light emitting member 50 as described above, the second surface 50b side of light emitting member 50 may be processed to form a protrusion-recess structure which may then be used as first heat dissipation member 14. Although a fin structure is shown as the first protrusion-recess structure portion in FIGS. 7 and 8, any other structure may be employed as the first protrusion-recess structure. For example, first heat dissipation member 14 may be provided with, instead of the fins, a columnar structure such as a cylinder or a prism, or a protrusion structure such as a cone or a pyramid, as the first protrusion-recess structure portion.

<Operation as well as Function and Effect of Light Emitting Apparatus>

The light emitting apparatus shown in FIGS. 7 and 8 basically produces similar effects to those of the light emitting apparatus shown in FIGS. 1 and 2. In the light emitting apparatus shown in FIGS. 7 and 8, when the temperature of light emitting member 50 increases, heat is conducted from second surface 50b of light emitting member 50 to first heat dissipation member 14, causing an increase in temperature of this first heat dissipation member 14. Here, since first heat dissipation member 14 is formed, the area of a heat transfer path through which the heat generated by the light irradiation is transferred from light emitting member 50 to coolant 4 is increased as compared to an example where this first heat dissipation member 14 is not formed. Accordingly, thermal resistance between light emitting plate 1 and coolant 4 is reduced. Stated from a different perspective, since first heat dissipation member 14 has the fin structure as the first protrusion-recess structure portion, the area of contact between first heat dissipation member 14 and coolant 4 is increased. Thus, the efficiency of heat transfer from light emitting member 50 to coolant 4 can be increased through first heat dissipation member 14. Accordingly, when cooling light emitting member 50 by coolant 4, the temperature difference between light emitting member 50 and coolant 4 can be reduced, to further reduce the temperature of light emitting member 50 as compared to that of the light emitting apparatus according to Embodiment 1.

<Configuration as well as Function and Effect of First Modification of Light Emitting Apparatus>

Figure 9:
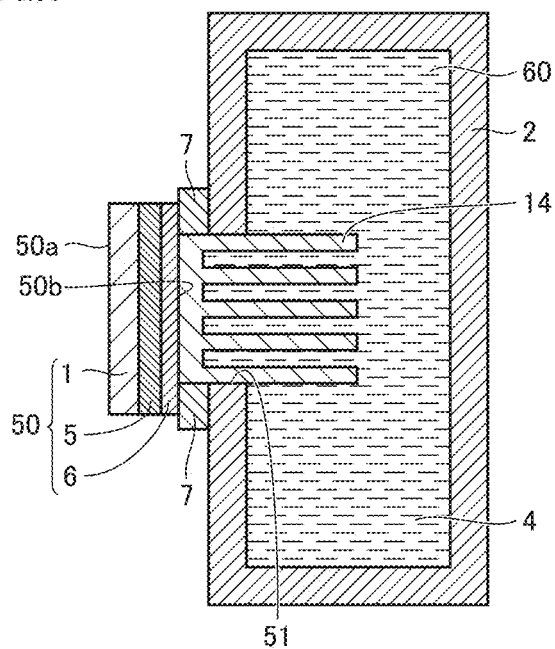
FIG. 9 is a schematic cross-sectional view of a light emitting apparatus according to a first modification of Embodiment 2 of the present invention.

FIG. 9 is a schematic cross-sectional view of a light emitting apparatus according to a first modification of Embodiment 2 of the present invention. FIG. 9 corresponds to FIG. 8, and shows a cross section of the light emitting apparatus taken along a plane (horizontal plane) perpendicular to the direction of gravity.

The light emitting apparatus shown in FIG. 9 basically has a similar configuration to the light emitting apparatus shown in FIGS. 7 and 8, but is different from the light emitting apparatus shown in FIGS. 7 and 8 in the disposition of the plurality of fins constituting the fin structure of first heat dissipation member 14. In the light emitting apparatus shown in FIG. 9, the plurality of fins are formed such that the main surfaces of the fins extend in a direction along the direction of gravity. By so doing, when bubbles formed by boiling of coolant 4 at the surface of first heat dissipation member 14 move upward in the direction of gravity, the fins are less likely to hinder the movement of the bubbles. In other words, the bubbles can be quickly moved upward, so that a delay in supply of coolant 4 to the surface of first heat dissipation member 14 is avoided.

Although the fins are formed such that the main surfaces of the fins extend along the direction of gravity in FIG. 9, the direction of the main surfaces of the fins may be inclined a prescribed angle relative to the direction of gravity. For example, this prescribed angle may be greater than 0° and equal to or less than 45°. The upper limit of this angle may be 40°, 30°, or 20°. The lower limit of this angle may be 2°, 5°, or 10°.

<Configuration as well as Function and Effect of Second Modification of Light Emitting Apparatus>

Figure 10:
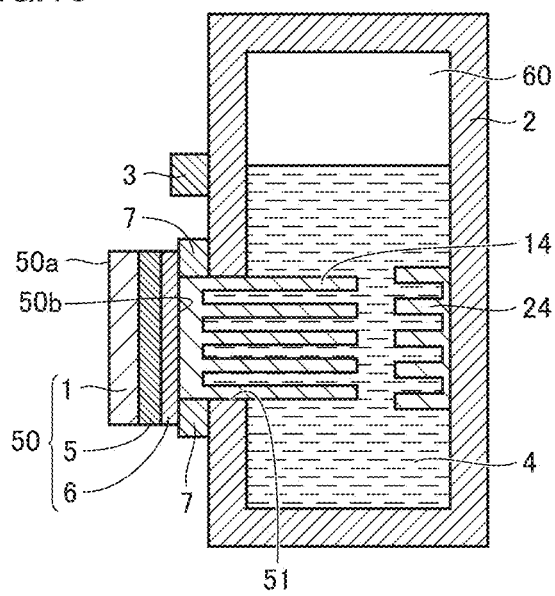
FIG. 10 is a schematic cross-sectional view of a light emitting apparatus according to a second modification of Embodiment 2 of the present invention.

FIG. 10 is a schematic cross-sectional view of a light emitting apparatus according to a second modification of Embodiment 2 of the present invention. FIG. 10 corresponds to FIG. 7.

The light emitting apparatus shown in FIG. 10 basically has a similar configuration to the light emitting apparatus shown in FIG. 9, but is different from the light emitting apparatus shown in FIG. 9 in that it includes a second heat dissipation member 24. Second heat dissipation member 24 is connected to the inner wall surface of holding portion 60. Second heat dissipation member 24 includes a fin structure as a second protrusion-recess structure portion. Second heat dissipation member 24 is disposed lower than the liquid level of coolant 4 as shown in FIG. 10. Such a configuration can obtain similar effects to those of the light emitting apparatus shown in FIG. 9, and can efficiently transfer the heat, which has been transferred from light emitting member 50 to coolant-sealed portion 2, to coolant 4 through second heat dissipation member 24.

Here, the first protrusion-recess structure portion and the second protrusion-recess structure portion described above mean a structure having a surface provided with a protrusion or a recess. The protrusion includes a protrusion of any shape, such as a plate-like protrusion as typified by a fin, and a columnar protrusion. The recess includes a recess having a circular shape or a polygonal shape in plan view, and a linear groove.

<Configuration as well as Function and Effect of Third Modification of Light Emitting Apparatus>

Figure 11:
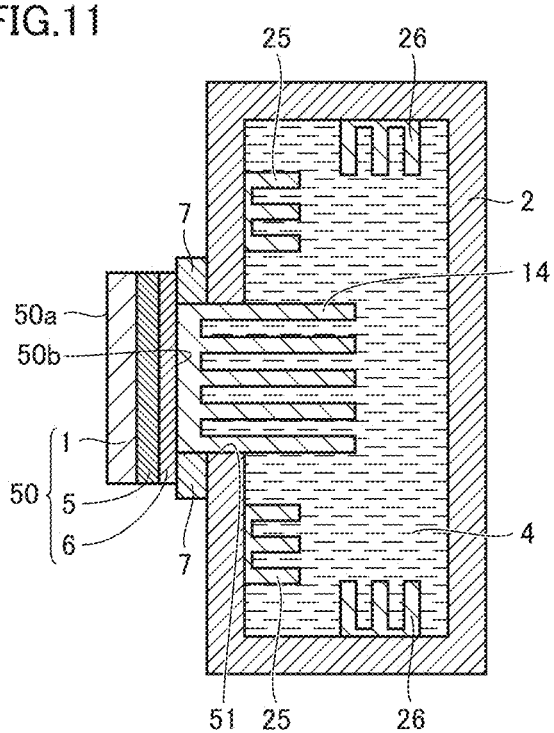
FIG. 11 is a schematic cross-sectional view of a light emitting apparatus according to a third modification of Embodiment 2 of the present invention.

FIG. 11 is a schematic cross-sectional view of a light emitting apparatus according to a third modification of Embodiment 2 of the present invention. FIG. 11 corresponds to FIG. 9.

The light emitting apparatus shown in FIG. 11 basically has a similar configuration to the light emitting apparatus shown in FIG. 10, but is different in the disposition of the second heat dissipation member. That is, second heat dissipation member 24 is disposed to face first heat dissipation member 14 in FIG. 10, whereas in the light emitting apparatus shown in FIG. 11, it is formed to be aligned with first heat dissipation member 14 on the inner side of the wall of coolant-sealed portion 2 provided with opening 51. Another second heat dissipation member 26 is formed on another wall intersecting the wall of coolant-sealed portion 2 provided with opening 51. Second heat dissipation members 25 and 26 each have a fin structure as the second protrusion-recess structure portion, and basically have a similar configuration to second heat dissipation member 24 shown in FIG. 10. Such a configuration can also obtain similar effects to those of the light emitting apparatus shown in FIG. 10. That is, the heat transferred from light emitting member 50 to coolant-sealed portion 2 can be efficiently transferred to coolant 4 through second heat dissipation members 25 and 26.

In the light emitting apparatuses according to Embodiment 2 described above, heat dissipating fins 13 and fins 33 of Embodiment 1 shown in FIGS. 5 and 6 may be installed. In the light emitting apparatuses according to Embodiment 2 described above, the plurality of light emitting members 50 may be disposed, and the shape or disposition of the phosphor may be adjusted, as with the light emitting apparatus according to Embodiment 1.

Embodiment 3

<Basic Configuration of Light Emitting Apparatus>

Figure 12:
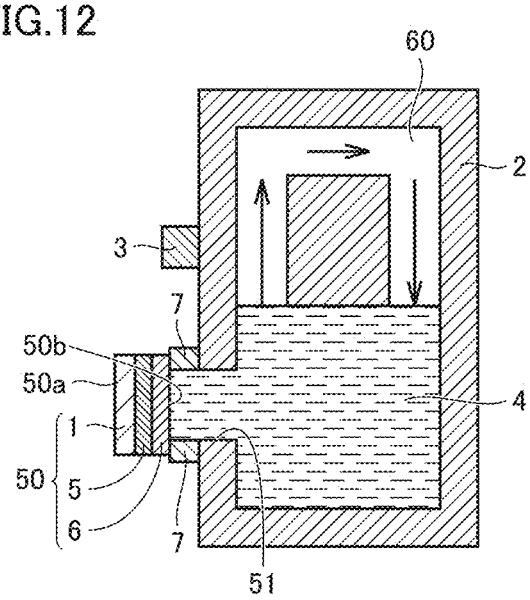
FIG. 12 is a schematic cross-sectional view illustrating a basic configuration of a light emitting apparatus according to Embodiment 3 of the present invention.

FIG. 12 is a schematic cross-sectional view illustrating a basic configuration of a light emitting apparatus according to Embodiment 3 of the present invention. FIG. 12 corresponds to FIG. 2, and schematically represents a flow of coolant 4 in a circulation channel constituted by holding portion 60.

The light emitting apparatus shown in FIG. 12 basically has a similar configuration to the light emitting apparatus shown in FIGS. 1 and 2, but is different in that holding portion 60 constitutes the circulation channel. In other words, in the light emitting apparatus shown in FIG. 12, holding portion 60 includes a circulation channel allowing coolant 4 to flow therethrough. Stated from a different perspective, the channel for coolant 4 is loop-shaped in holding portion 60. Opening 51 is provided to communicate with a portion of the channel. In other words, holding portion 60 serves as a loop-shaped channel, and light emitting member 50 is attached to a location in that channel that is in contact with coolant 4 at all times. Opening 51 is formed to communicate with a position of this channel where coolant 4 is stored at all times. First heat dissipation member 14 as was illustrated in Embodiment 2 may be formed to be in contact with second surface 50b.

<Operation as well as Function and Effect of Light Emitting Apparatus>

With a configuration as described above, similar effects to those of the light emitting apparatus shown in FIGS. 1 and 2 can be obtained, and when coolant 4 boils at second surface 50b of light emitting member 50, this coolant 4 can circulate through the circulation channel.

Specifically, as in Embodiment 1, when light emitting member 50 is irradiated with excitation light, the temperature of light emitting member 50 increases due to heat generation caused by a loss that occurs because of an energy difference between the excitation light and fluorescent light, or due to light absorption into the material itself. Heat generated at light emitting member 50 is conducted to second surface 50b of the light emitting member, causing an increase in temperature of coolant 4 in direct contact with the rear surface. As a result of this temperature increase, convection of coolant 4 occurs in the channel of holding portion 60. Accordingly, new coolant 4 is successively supplied to second surface 50b, thus allowing a reduction in temperature of second surface 50b of light emitting member 50. Moreover, as was described in Embodiment 1, the movement of coolant 4 is facilitated due to the boiling phenomenon. Here, since holding portion 60 serves as a loop-shaped channel, convecting coolant 4 flows to circulate through this channel. Coolant 4 is cooled while flowing through the channel, and has a reduced temperature upon returning to the position in contact with second surface 50b of light emitting member 50. Therefore, the temperature of light emitting member 50 can be maintained at low level.

Here, in the structure of Embodiment 1, increasing coolant-sealed portion 2 causes a reduction in convection of coolant 4 at a location at a great distance from light emitting member 50. In contrast, in the light emitting apparatus according to Embodiment 3 described above, increasing coolant-sealed portion 2 to increase the volume of holding portion 60 still allows efficient convention of coolant 4 throughout holding portion 60. Thus, a greater amount of heat generation at light emitting member 50 can be addressed.

<First Configuration Example of Light Emitting Apparatus as well as Function and Effect>

Figure 13:
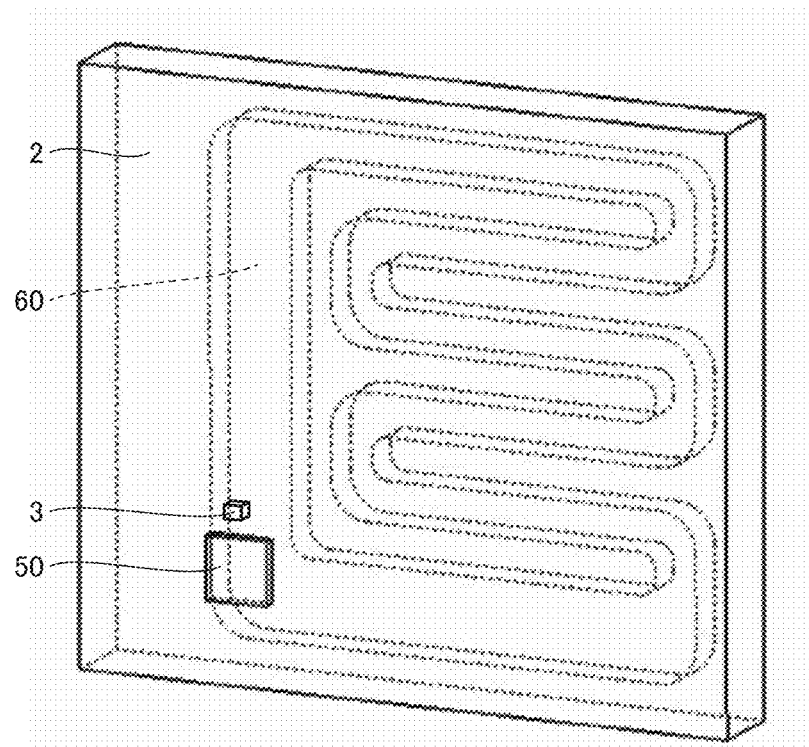
FIG. 13 is a schematic perspective view illustrating a first configuration example of the light emitting apparatus according to Embodiment 3 of the present invention.

FIG. 13 is a schematic perspective view illustrating a first configuration example of the light emitting apparatus according to Embodiment 3 of the present invention.

The light emitting apparatus shown in FIG. 13 basically has a similar configuration to the light emitting apparatus shown in FIG. 12, but is different from the light emitting apparatus shown in FIG. 12 in the shape of the circulation channel included in holding portion 60. In the light emitting apparatus shown in FIG. 13, the circulation channel includes a linear portion extending along the direction of gravity, and a meandering portion connected to opposite ends of this linear portion and extending in a meandering manner to include a plurality of corner portions. Light emitting member 50 is disposed to face a lower portion of the linear portion in the direction of gravity. Stated from a different perspective, the circulation channel for coolant 4 expands into a plane along second surface 50b of light emitting member 50 (see FIG. 12) in a planar direction including the direction of gravity and the horizontal direction. Temperature sensor 3 is disposed at a position facing the circulation channel.

Such a configuration can also obtain similar effects to those of the light emitting apparatus shown in FIG. 12. Moreover, since the channel length of the circulation channel is extended by the formation of the meandering portion, a sufficient amount of coolant 4 (see FIG. 12) can be held in the channel.

<Second Configuration Example of Light Emitting Apparatus as well as Function and Effect>

Figure 14:
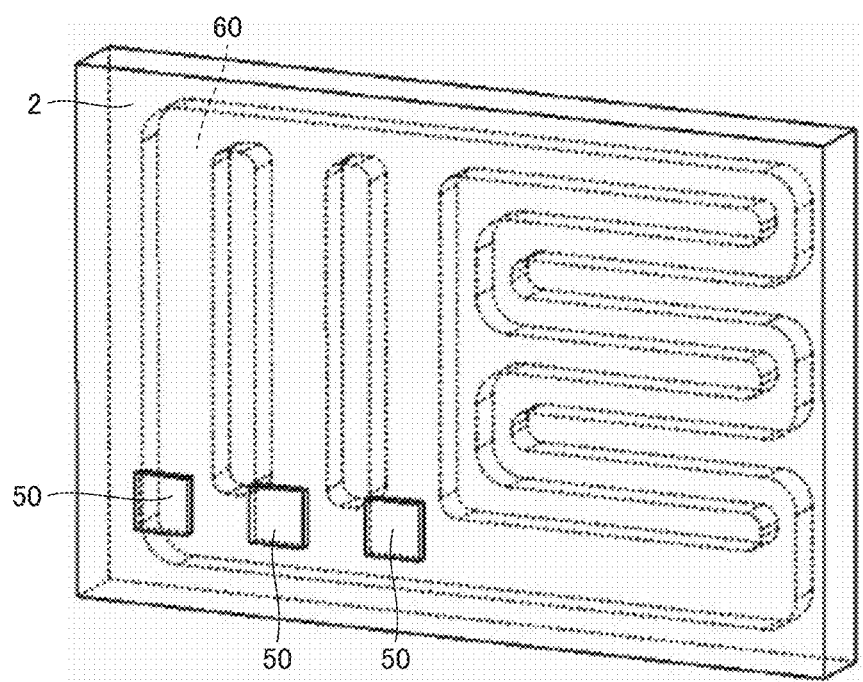
FIG. 14 is a schematic perspective view illustrating a second configuration example of the light emitting apparatus according to Embodiment 3 of the present invention.

FIG. 14 is a schematic perspective view illustrating a second configuration example of the light emitting apparatus according to Embodiment 3 of the present invention. The light emitting apparatus shown in FIG. 14 basically has a similar configuration to the light emitting apparatus shown in FIG. 13, but is different from the light emitting apparatus shown in FIG. 13 in the shape of the circulation channel included in holding portion 60, and the number of light emitting members 50. In the light emitting apparatus shown in FIG. 14, a plurality of linear portions of the circulation channel are disposed to be aligned in parallel, each of which is connected to the meandering portion. Light emitting member 50 is disposed in the lower portion of each of the plurality of linear portions. Stated from a different perspective, the light emitting apparatus includes, in addition to one light emitting member 50, at least one other light emitting member 50. At least one other light emitting member 50 has a similar configuration to light emitting member 50 shown in FIG. 12. The configuration of other light emitting member 50 is described below with reference to FIG. 12. At least one other light emitting member 50 includes a third surface 50a including a phosphor irradiated with light to emit light, and a fourth surface 50b different from the third surface. The surface of coolant-sealed portion 2 is provided with at least one other opening 51 communicating with holding portion 60. In FIG. 14, this other opening is disposed at a position overlapping with other light emitting members 50. At least one other light emitting member 50 is connected to coolant-sealed portion 2 such that fourth surface 50b closes at least one other opening 51. The circulation channel is formed to connect opening 51 and the at least one other opening in parallel.

In this case, the amount of coolant 4 in contact with the rear surfaces of the plurality of light emitting members 50 (see FIG. 12) can be stabilized.

<Third Configuration Example of Light Emitting Apparatus as well as Function and Effect>

Figure 15:
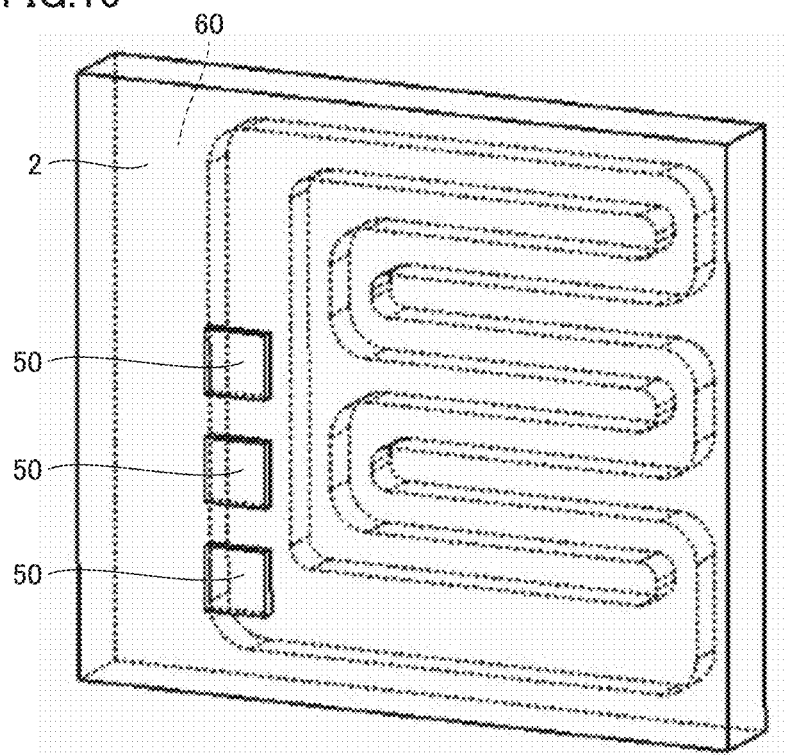
FIG. 15 is a schematic perspective view illustrating a third configuration example of the light emitting apparatus according to Embodiment 3 of the present invention.

FIG. 15 is a schematic perspective view illustrating a third configuration example of the light emitting apparatus according to Embodiment 3 of the present invention. The light emitting apparatus shown in FIG. 15 basically has a similar configuration to the light emitting apparatus shown in FIG. 14, but is different from the light emitting apparatus shown in FIG. 14 in the disposition of light emitting members 50 and the shape of the circulation channel. The plurality of light emitting members 50 are disposed to be aligned along the linear portion of the circulation channel. The plurality of light emitting members 50 are disposed to be vertically aligned along the direction of gravity. The shape of the circulation channel is similar to the shape of the circulation channel of the light emitting apparatus shown in FIG. 13.

Stated from a different perspective, the light emitting apparatus includes, in addition to one light emitting member 50, at least one other light emitting member 50. At least one other light emitting member 50 has a similar configuration to light emitting member 50 shown in FIG. 12. The configuration of other light emitting member 50 is described below with reference to FIG. 12, as with the light emitting apparatus shown in FIG. 14. At least one other light emitting member 50 includes third surface 50a including a phosphor irradiated with light to emit light, and fourth surface 50b different from the third surface. The surface of coolant-sealed portion 2 is provided with at least one other opening 51 communicating with holding portion 60. In FIG. 15, this other opening is disposed at a position overlapping with other light emitting members 50, as in FIG. 14. At least one other light emitting member 50 is connected to coolant-sealed portion 2 such that fourth surface 50b closes at least one other opening 51. The circulation channel is formed to connect opening 51 and the at least one other opening in series.

In this case, in the configuration where the plurality of light emitting members 50 are disposed, these plurality of light emitting members 50 can be efficiently cooled by coolant 4 (see FIG. 12).

In the light emitting apparatuses according to Embodiment 3 described above, heat dissipating fins 13 and fins 33 of Embodiment 1 shown in FIGS. 5 and 6 may be installed. In the light emitting apparatuses according to Embodiment 3 described above, the shape or disposition of the phosphor may be adjusted, as with the light emitting apparatus according to Embodiment 1. In the light emitting apparatuses according to Embodiment 3 described above, first heat dissipation member 14 may be connected to each of light emitting members 50, and second heat dissipation members 24 to 26 may be disposed, as was illustrated in Embodiment 2.

In the light emitting apparatuses described above, at least one other light emitting member 50 described above may include another metal layer 6 constituting fourth surface 50b. The light emitting apparatuses may further include joining member 7 for joining a portion of other metal layer 6 described above to a region of the surface of coolant-sealed portion 2 as a housing that surrounds at least one other opening 51. In the light emitting apparatuses described above, coolant 4 may be disposed within holding portion 60 so as to reach a region located higher than at least one other opening 51 in the direction of gravity in holding portion 60.

Embodiment 4

<Configuration of Light Emitting Apparatus>

Figure 16:
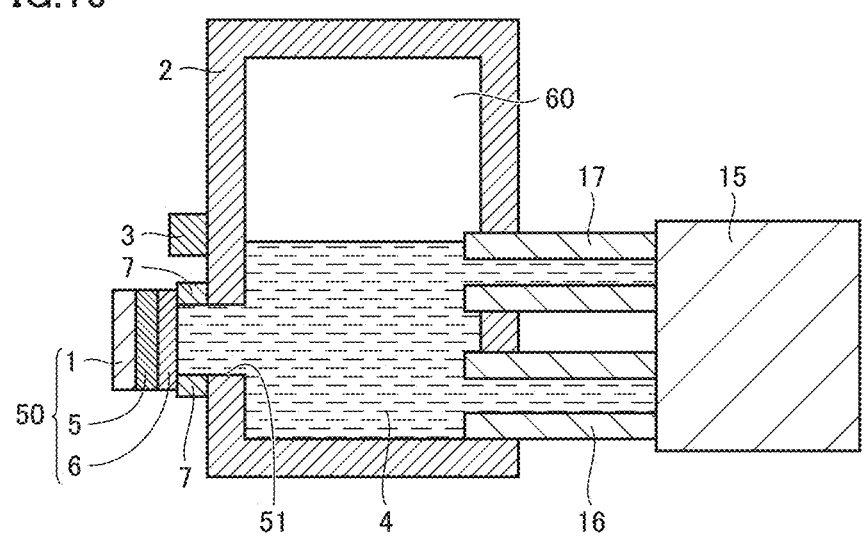
FIG. 16 is a schematic cross-sectional view of a light emitting apparatus according to Embodiment 4 of the present invention.

FIG. 16 is a schematic cross-sectional view of a light emitting apparatus according to Embodiment 4 of the present invention. The light emitting apparatus shown in FIG. 16 basically has a similar configuration to the light emitting apparatus shown in FIGS. 1 and 2, but is different from the light emitting apparatus shown in FIGS. 1 and 2 in that it includes a pump 15 as a driving member for causing coolant 4 to flow toward opening 51 within holding portion 60. As shown in FIG. 16, coolant-sealed portion 2 is provided with a discharge portion 16 and a suction portion 17 for coolant 4. Light emitting member 50 is attached to a location impinged by coolant 4 discharged from discharge portion 16. Pump 15 is attached to a loop path connecting discharge portion 16, suction portion 17, and the inside of holding portion 60. In other words, pump 15 is connected to discharge portion 16 and suction portion 17. Coolant 4 discharged from pump 15 impinges, through discharge portion 16, on the rear surface of light emitting member 50 through opening 51.

<Operation as well as Function and Effect of Light Emitting Apparatus>

In the light emitting apparatus shown in FIG. 16, as in Embodiment 1, when light emitting member 50 is irradiated with excitation light, the temperature of a portion irradiated with the excitation light increases due to heat generation caused by a loss that occurs because of an energy difference between the excitation light and fluorescent light, or due to light absorption into the material for light emitting member 50. Here, coolant 4 flows from pump 15 so as to impinge on the rear surface of light emitting member 50 through discharge portion 16. Accordingly, the flow of coolant 4 in contact with the rear surface of light emitting member 50 is facilitated, leading to lower thermal resistance between light emitting member 50 and coolant 4 than that of the structure of Embodiment 1. In other words, coolant 4 can be forcibly supplied to light emitting member 50 through opening 51, to facilitate the heat transfer from light emitting member 50 to coolant 4. Thus, the temperature of light emitting member 50 can be further reduced.

In the light emitting apparatus according to Embodiment 4 described above, heat dissipating fins 13 and fins 33 of Embodiment 1 shown in FIGS. 5 and 6 may be installed. In the light emitting apparatus according to Embodiment 4 described above, the shape or disposition of the phosphor may be adjusted as with the light emitting apparatus according to Embodiment 1, or holding portion 60 may be provided with the circulation channel and the plurality of light emitting members 50 may be disposed as in Embodiment 3. The plurality of light emitting members 50 may be disposed in parallel or in series as shown in FIGS. 14 and 15. In the light emitting apparatus according to Embodiment 4 described above, first heat dissipation member 14 and second heat dissipation members 24 to 26 as were illustrated in Embodiment 2 may be disposed.

Embodiment 5

<Configuration of Light Emitting Apparatus>

Figure 17:
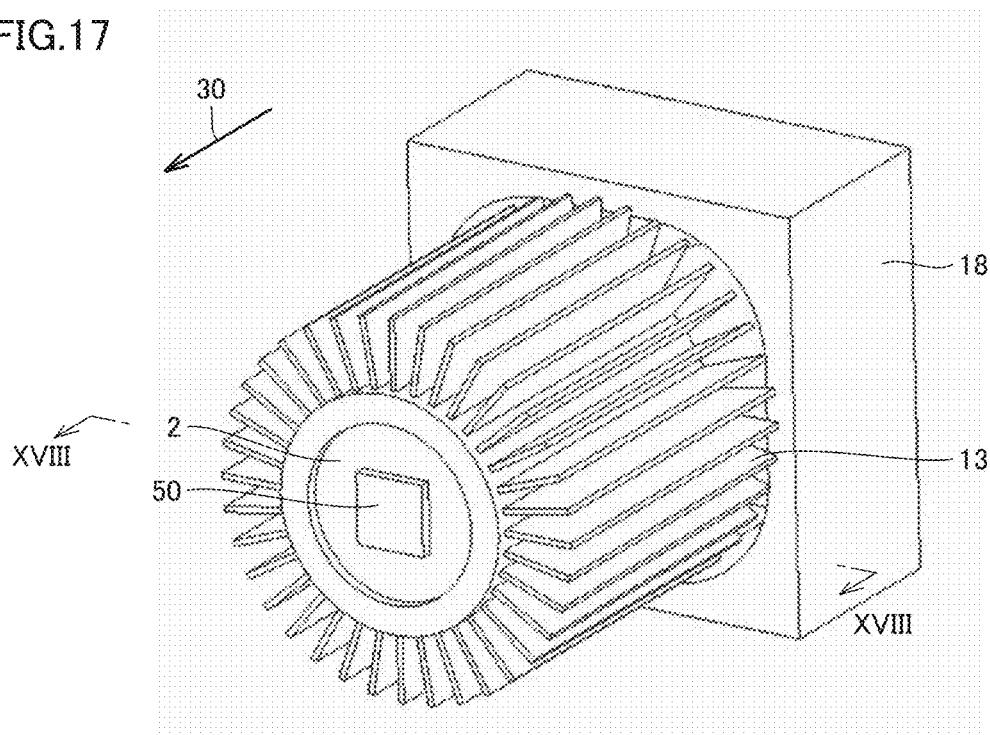
FIG. 17 is a schematic perspective view of a light emitting apparatus according to Embodiment 5 of the present invention.
Figure 18:
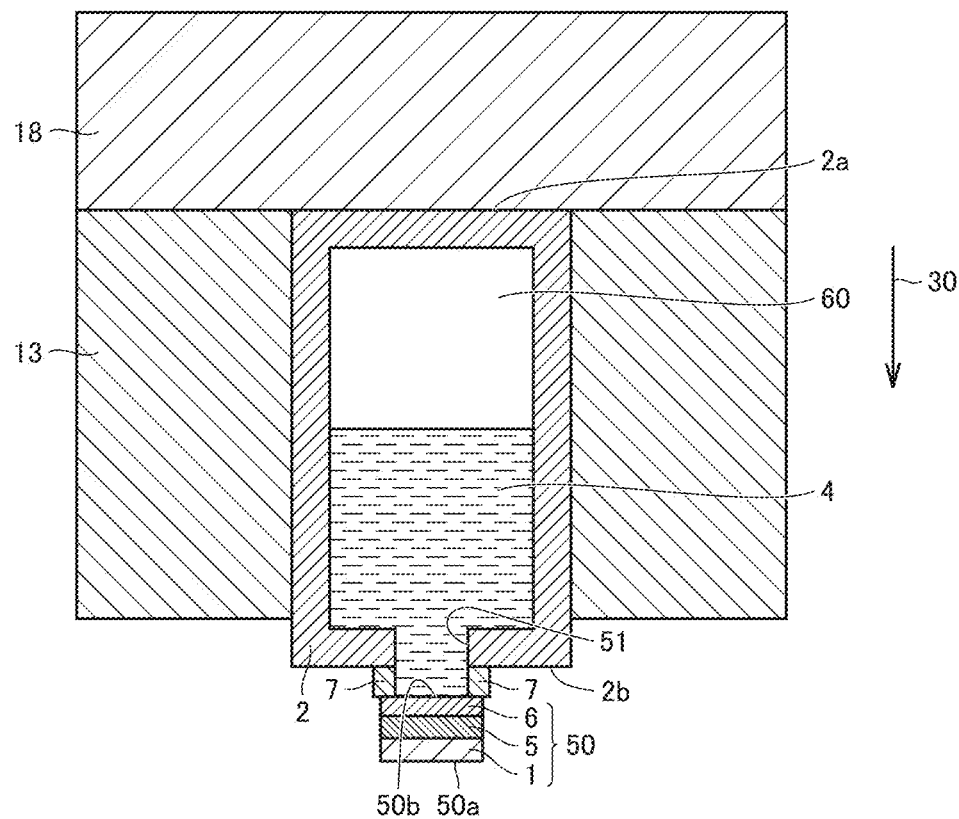
FIG. 18 is a schematic cross-sectional view taken along the line XVIII-XVIII in FIG. 17.

FIG. 17 is a schematic perspective view of a light emitting apparatus according to Embodiment 5 of the present invention. FIG. 18 is a schematic cross-sectional view taken along the line XVIII-XVIII in FIG. 17. The light emitting apparatus shown in FIGS. 17 and 18 basically has a similar configuration to the light emitting apparatus shown in FIGS. 1 and 2, but is different from the light emitting apparatus shown in FIGS. 1 and 2 in the configuration of coolant-sealed portion 2, the disposition of light emitting member 50, and in that an axial fan 18 and heat dissipating fins 13 are added. In the light emitting apparatus shown in FIGS. 17 and 18, coolant-sealed portion 2 has a cylindrical shape having an axis over an extension of a rotational axis of axial fan 18. Coolant-sealed portion 2 includes an upper surface 2a and a lower surface 2b in the direction of gravity indicated by an arrow 30, and a side surface connecting these upper surface 2a and lower surface 2b. Upper surface 2a of coolant-sealed portion 2 has axial fan 18 installed thereon. Lower surface 2b of coolant-sealed portion 2 is provided with opening 51, with light emitting member 50 disposed to close this opening 51. Light emitting member 50, and the connection connected to coolant-sealed portion 2 by joining member 7 so as to close opening 51 are similar in configuration to the light emitting apparatus shown in FIGS. 1 and 2. The side surface of coolant-sealed portion 2 is provided with heat dissipating fins 13 so as to provide grooves in a direction of airflow from axial fan 18.

Stated from a different perspective, the characteristic configuration of the light emitting apparatus described above is such that, in the light emitting apparatus, coolant-sealed portion 2 has upper surface 2a and lower surface 2b located opposite to this upper surface 2a in the direction of gravity indicated by arrow 30. Lower surface 2b of coolant-sealed portion 2 is provided with opening 51. The light emitting apparatus further includes axial fan 18 as a blower fan disposed on upper surface 2a of coolant-sealed portion 2. Coolant-sealed portion 2 has a cylindrical shape having a major axis in the direction of gravity.

<Operation as well as Function and Effect of Light Emitting Apparatus>

In the light emitting apparatus described above, the phosphor of light emitting member 50 is irradiated with excitation light, and generated heat is transferred to coolant 4. Here, operating axial fan 18 facilitates heat transfer between the surface of coolant-sealed portion 2, particularly heat dissipating fins 13, and outside air. Coolant 4 within holding portion 60 is thereby cooled. By setting the axial direction of cylindrical coolant-sealed portion 2 as the direction of gravity, convection occurs due to a temperature difference in coolant 4, thus further facilitating the cooling of light emitting member 50. In addition, since coolant 4 remains on a bottom surface of holding portion 60, the possibility of loss of coolant 4 in contact with second surface 50b of light emitting member 50 is low even if a boiling state of coolant 4 continues at second surface 50b of light emitting member 50. The axis of cylindrical coolant-sealed portion 2 may be horizontally orientated, as long as coolant-sealed portion 2 has such a shape that second surface 50b of light emitting member 50 is disposed lower than the liquid level of coolant 4.

By disposing coolant-sealed portion 2 along the rotational axis of axial fan 18 in this manner, thermal resistance between coolant 4 and outside air can be reduced using airflow from axial fan 18. Accordingly, the amount of light emission can be increased as compared to that of the light emitting apparatus according to Embodiment 1. In other words, when the amount of heat generation at light emitting member 50 is increased, airflow can be generated outside coolant-sealed portion 2 to efficiently cool coolant 4. That is, a compact and highly efficient light emitting apparatus can be attained.

In addition, the cylindrical space which is holding portion 60 for sealing coolant 4 therein, and heat dissipating fins 13 on the surface of coolant-sealed portion 2 can be formed simultaneously by forming coolant-sealed portion 2 by extrusion molding or the like. Accordingly, coolant-sealed portion 2 can be manufactured at low cost. The inner wall side of coolant-sealed portion 2 may also be provided with a protrusion-recess shape extending in a direction along the cylindrical axis, to facilitate the heat transfer between coolant 4 and coolant-sealed portion 2. Such a protrusion-recess shape can also be readily formed by the extrusion molding or the like described above.

Moreover, cylindrical coolant-sealed portion 2 may be rotated around the rotational axis. Bo so doing, coolant 4 within coolant-sealed portion 2 can be stirred. In the light emitting apparatus described above, coolant-sealed portion 2 is configured to rotate around the rotational axis. First surface 50a of light emitting member 50 includes a portion not overlapping with the rotational axis. In this case, the application position of the excitation light collected on light emitting member 50 can be displaced from the rotational axis, to have distributed locations of heat generation on light emitting member 50. Stated from a different perspective, the portion of first surface 50a of light emitting member 50 that does not overlap with the rotational axis may be irradiated with light such as laser light to emit light. In this case, the portion of first surface 50a that does not overlap with the rotational axis can serve as a light emission point. This light emission point moves over first surface 50a as coolant-sealed portion 2 rotates. Accordingly, the light emission point, which is a location irradiated with light to generate heat, can be prevented from being focused on one point. Moreover, the rotation of coolant-sealed portion 2 can stir coolant 4 as a refrigerant within holding portion 60, thereby effectively cooling light emitting member 50 by coolant 4. Accordingly, the temperature of light emitting member 50 can be reduced. Coolant-sealed portion 2 may be configured to rotate around the rotational axis in the light emitting apparatuses according to the other embodiments as well. First surface 50a of light emitting member 50 may include a portion not overlapping with the rotational axis in the other embodiments.

Embodiment 6

<Configuration of Light Emitting Apparatus>

Figure 19:
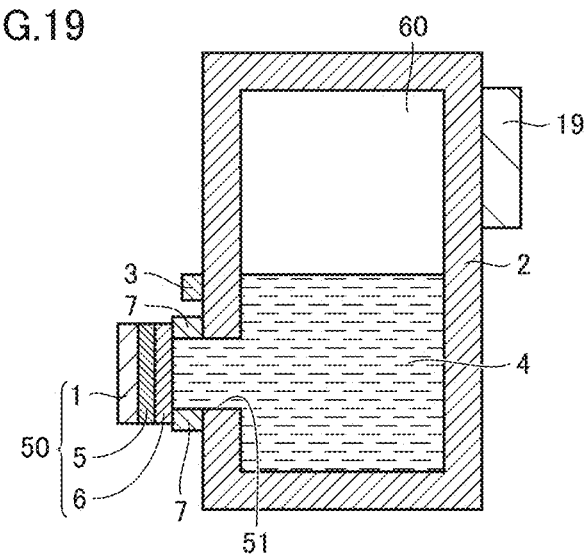
FIG. 19 is a schematic cross-sectional view of a light emitting apparatus according to Embodiment 6 of the present invention.
Figure 20:
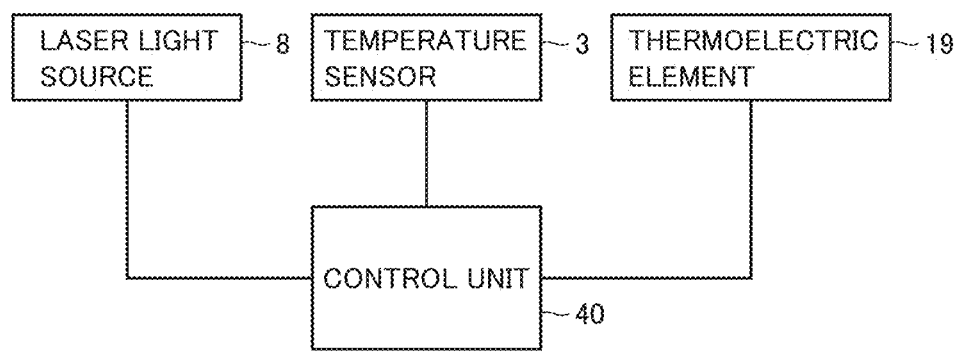
FIG. 20 is a block diagram illustrating control of the light emitting apparatus shown in FIG. 19 in an electronic device having the light emitting apparatus mounted thereon.

FIG. 19 is a schematic cross-sectional view of a light emitting apparatus according to Embodiment 6 of the present invention. FIG. 20 is a block diagram illustrating control of the light emitting apparatus shown in FIG. 19 in an electronic device having the light emitting apparatus mounted thereon. The light emitting apparatus shown in FIG. 19 basically has a similar configuration to light emitting apparatus 100 shown in FIGS. 1 and 2, but is different from light emitting apparatus 100 shown in FIGS. 1 and 2 in that it includes a thermoelectric element 19 connected to coolant-sealed portion 2. Thermoelectric element 19 may be disposed higher than the liquid level of coolant 4, or lower than the liquid level of coolant 4, on coolant-sealed portion 2.

<Operation as well as Function and Effect of Light Emitting Apparatus>

In the light emitting apparatus shown in FIG. 19, light emitting member 50 is irradiated with excitation light, and coolant 4 is heated by heat generated at light emitting member 50. Heated coolant 4 is vaporized due to a boiling phenomenon. Thermoelectric element 19 cools one end of coolant-sealed portion 2 when energized. Vaporized coolant 4 is cooled and liquefied again by making contact with the cooled wall surface of coolant-sealed portion 2. Coolant 4 is vaporized in the vicinity of light emitting member 50 and liquefied in the vicinity of thermoelectric element 19 in this manner, to thereby vertically circulate through holding portion 60. Thermoelectric element 19 may be provided on its outer side with means for dissipating heat generated by thermoelectric element 19.

Coolant 4 is cooled by ambient air in Embodiments 1 to 5 described above, whereas coolant 4 is cooled with thermoelectric element 19 disposed on coolant-sealed portion 2 in this Embodiment 6, so that coolant 4 can be cooled down to a temperature lower than ambient temperature. As a result, light emitting member 50 can be sufficiently cooled by coolant 4.

The portion of the inner wall of coolant-sealed portion 2 that is in contact with thermoelectric element 19 may have a groove shape or a protrusion-recess structure such as a fin structure in order to facilitate the heat transfer.

In the electronic device having the light emitting apparatus described above and laser light source 8 as shown in FIG. 3 mounted thereon, control unit 40 may be connected to laser light source 8, temperature sensor 3 of the light emitting apparatus, and thermoelectric element 19, as shown in FIG. 20. In this case, an operational state such as output from laser light source 8 or ON/OFF of thermoelectric element 19 can be controlled by control unit 40 such that the temperature of light emitting member 50 is maintained at sufficiently low level based on the temperature measurement data from temperature sensor 3, for example.

In the light emitting apparatus according to Embodiment 6 described above, heat dissipating fins 13 and fins 33 of Embodiment 1 shown in FIGS. 5 and 6 may be installed. In the light emitting apparatus according to Embodiment 6 described above, the shape or disposition of the phosphor may be adjusted as with the light emitting apparatus according to Embodiment 1, or holding portion 60 may be provided with the circulation channel and the plurality of light emitting members 50 may be disposed as in Embodiment 3. The plurality of light emitting members 50 may be disposed in parallel or in series as shown in FIGS. 14 and 15. In the light emitting apparatus according to Embodiment 6 described above, first heat dissipation member 14 and second heat dissipation members 24 to 26 as were illustrated in Embodiment 2 may be disposed.

Embodiment 7

<Configuration of Light Emitting Apparatus>

Figure 21:
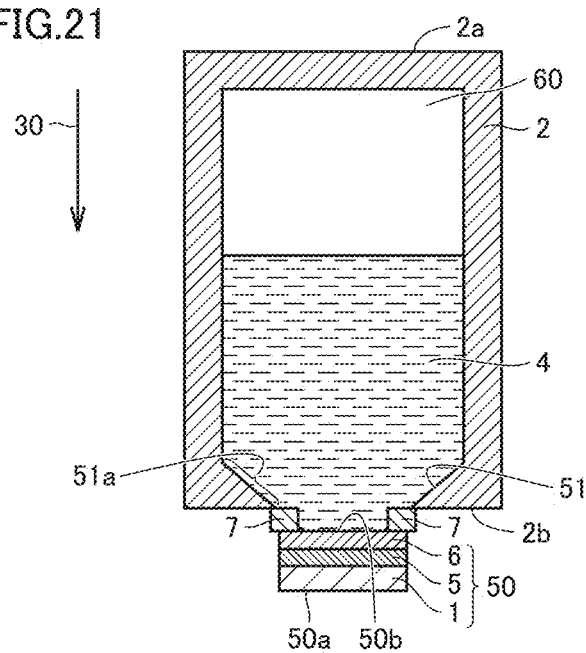
FIG. 21 is a schematic cross-sectional view of a light emitting apparatus according to Embodiment 7 of the present invention.

FIG. 21 is a schematic cross-sectional view of a light emitting apparatus according to Embodiment 7 of the present invention. The light emitting apparatus shown in FIG. 21 basically has a similar configuration to the light emitting apparatus shown in FIGS. 1 and 2, but is different from the light emitting apparatus shown in FIGS. 1 and 2 in the disposition of light emitting member 50 and the shape of opening 51. In the light emitting apparatus shown in FIG. 21, light emitting member 50 is disposed in the lower portion of coolant-sealed portion 2 where coolant 4 remains, and opening 51 in coolant-sealed portion 2 is provided in the lowermost portion of coolant-sealed portion 2 such that coolant 4 is in contact with second surface 50b which is the rear surface of light emitting member 50. An inner peripheral side surface 51a of opening 51 in coolant-sealed portion 2 is formed to be inclined toward light emitting member 50 relative to the direction indicated by arrow 30. Accordingly, the light emitting apparatus is made such that coolant 4 remains on second surface 50b of light emitting member 50 at all times, even when the light emitting apparatus is subjected to acceleration, or when the posture of the light emitting apparatus is changed such that first surface 50a which is the light emitting surface of light emitting member 50 is inclined relative to the direction of gravity indicated by arrow 30. Stated from a different perspective, in the light emitting apparatus described above, coolant-sealed portion 2 has upper surface 2a and lower surface 2b located opposite to upper surface 2a in the direction of gravity. Lower surface 2b of coolant-sealed portion 2 is provided with opening 51. Inner peripheral side surface 51a of opening 51 is inclined relative to the direction of gravity indicated by arrow 30 such that the width of opening 51 increases toward upper surface 2a.

<Operation as well as Function and Effect of Light Emitting Apparatus>

In the light emitting apparatus described above, light emitting member 50 is irradiated with excitation light, and coolant 4 is heated by generated heat. Heated coolant 4 is vaporized due to a boiling phenomenon. As in Embodiment 1, coolant 4 exchanges heat with the outside of coolant-sealed portion 2, and vaporized coolant 4 is liquefied. Light emitting member 50 is joined to coolant-sealed portion 2 as in Embodiment 1. Second surface 50b of light emitting member 50 is attached to the lower portion of the light emitting apparatus so as to be in direct contact with coolant 4. Accordingly, coolant 4 that has been returned to a liquid state returns to the vicinity of light emitting member 50 by gravity.

With this structure, coolant 4 can be quickly supplied to second surface 50b of the light emitting member, even when the posture of the light emitting apparatus is changed or bubbles are generated in coolant 4 due to facilitated heating of light emitting member 50. Stated from a different perspective, light emitting member 50 is disposed on lower surface 2b of coolant-sealed portion 2, and a portion of the wall surface of coolant-sealed portion 2 corresponding to inner peripheral side surface 51a of opening 51 is formed to be inclined toward the outside of opening 51. Thus, coolant 4 remains on second surface 50b of light emitting member 50 at all times, even when the posture of the light emitting apparatus is changed to cause lower surface 2b of coolant-sealed portion 2 to be inclined to some extent relative to the horizontal direction.

In this case, the loss of coolant 4 in contact with second surface 50b of light emitting member 50 can be suppressed when cooling light emitting member 50 by coolant 4.

In the light emitting apparatus according to Embodiment 7 described above, heat dissipating fins 13 and fins 33 of Embodiment 1 shown in FIGS. 5 and 6 may be installed. In the light emitting apparatus according to Embodiment 7 described above, the shape or disposition of the phosphor may be adjusted as with the light emitting apparatus according to Embodiment 1, or holding portion 60 may be provided with the circulation channel and the plurality of light emitting members 50 may be disposed as in Embodiment 3. The plurality of light emitting members 50 may be disposed in parallel or in series as shown in FIGS. 14 and 15. In the light emitting apparatus according to Embodiment 7 described above, first heat dissipation member 14 and second heat dissipation members 24 to 26 as were illustrated in Embodiment 2 may be disposed.

Embodiment 8

<Configuration as well as Function and Effect of Electronic Device>

Figure 22:
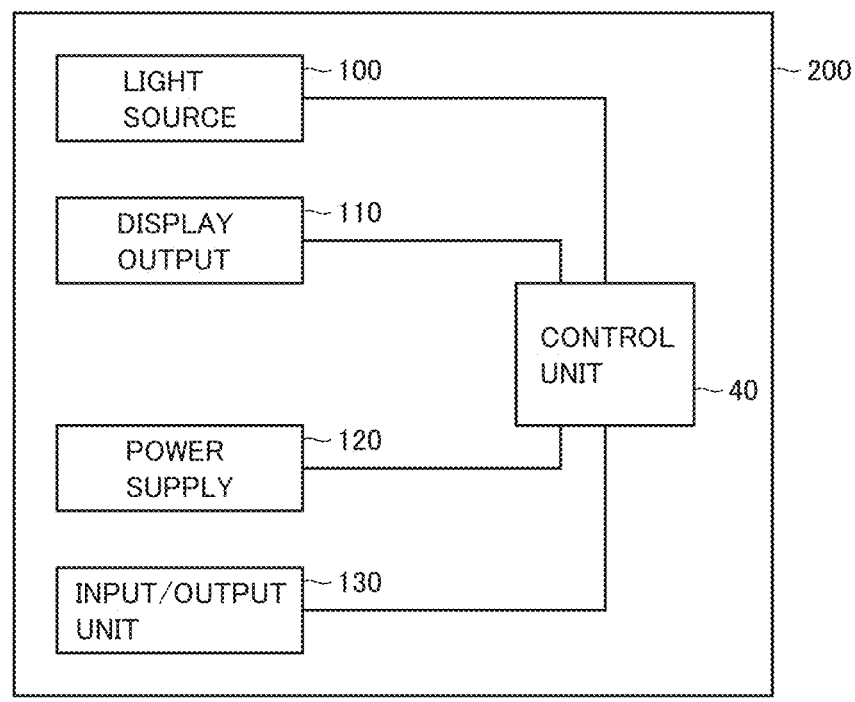
FIG. 22 is a block diagram illustrating the configuration of an electronic device according to Embodiment 8 of the present invention.

FIG. 22 is a block diagram illustrating the configuration of an electronic device according to Embodiment 8 of the present invention. An electronic device 200 shown in FIG. 22 is a projector, for example, and mainly includes control unit 40, light emitting apparatus 100 as a light source, a display output unit 110, a power supply 120, and an input/output unit 130. The light emitting apparatus according to any one of Embodiments 1 to 7 described above can be used as light emitting apparatus 100. Control unit 40 is connected to light emitting apparatus 100, display output unit 110, power supply 120, and input/output unit 130 described above. Light emitting apparatus 100 constitutes, together with the laser light source as was shown in FIG. 3, for example, a light source. Display output unit 110 projects a prescribed image and the like to the outside using light from the light source. Power supply 120 supplies electric power to control unit 40, the laser light source described above, and the like. Input/output unit 130 inputs/outputs data and the like from/to the outside. Stated from a different perspective, electronic device 200 includes light emitting apparatus 100 described above, and laser light source 8 as a light source. Laser light source 8 applies light to first surface 50a of light emitting member 50 in light emitting apparatus 100, as illustrated in FIG. 3.

As a result, highly efficient, highly reliable and long-life electronic device 200 can be obtained, by using highly efficient and highly reliable light emitting apparatus 100.

Embodiment 9

<Configuration as well as Function and Effect of Electronic Device>

Figure 23:
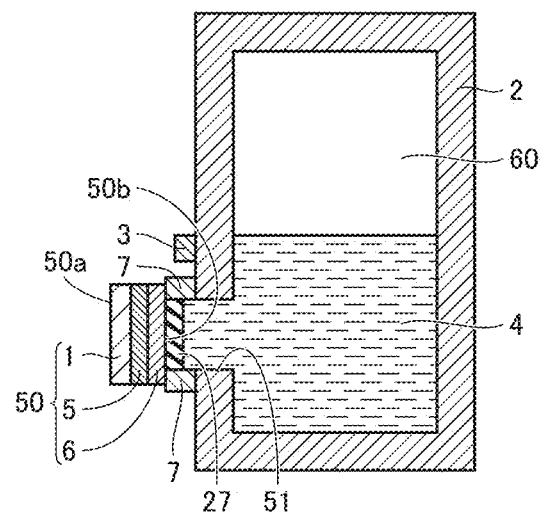
FIG. 23 is a schematic cross-sectional view of a light emitting apparatus according to Embodiment 9 of the present invention.

FIG. 23 is a schematic cross-sectional view of a light emitting apparatus according to Embodiment 9 of the present invention. The light emitting apparatus shown in FIG. 23 basically has a similar configuration to light emitting apparatus 100 shown in FIGS. 1 and 2, but is different from light emitting apparatus 100 shown in FIGS. 1 and 2 in that it includes a protective layer 27 disposed on the surface of metal layer 6 closer to coolant 4. Stated from a different perspective, protective layer 27 is formed on second surface 50b of light emitting member 50. Protective layer 27 is formed to cover a region of the surface of metal layer 6 closer to coolant 4 (second surface 50b) that is surrounded by an outer peripheral portion connected to joining member 7. Any material can be used as a material for protective layer 27. For example, an inorganic material such as silicon nitride, or an organic material including a resin material such as polyimide or silicone can be used. When an organic material is used as the material for protective layer 27, this organic material is preferably heat-resistant. The heat-resistant organic material refers to an organic matter having a continuous operating temperature equal to or higher than 140° C. In consideration of heat dissipation performance from metal layer 6 to coolant 4, the thickness of this protective layer 27 is desirably as small as possible. For example, the thickness of protective layer 27 may be equal to or greater than 1 nm and equal to or less than 1 μm. In this case, protective layer 27 may be a deposited film. Alternatively, the thickness of protective layer 27 may be equal to or greater than 1 μm and equal to or less than 200 μm. In this case, protective layer 27 may be an applied film.

The light emitting apparatus having a configuration as described above can basically obtain similar effects to those of light emitting apparatus 100 shown in FIGS. 1 and 2. When joining member 7 is made of metal such as solder, and coolant 4 is present at the joint of joining member 7 and metal layer 6, there is a concern that an electrochemical reaction might occur due to the difference in standard electrode potential between metal layer 6 and joining member 7. However, covering the surface of metal layer 6 with protective layer 27 can prevent coolant 4 from making contact with the joint described above. As a result, damage to metal layer 6 by the electrochemical reaction can be suppressed. When joining member 7 is to be melted and joined to metal layer 6 during a manufacturing process, since protective layer 27 is provided in advance to surround a central portion of the surface of metal layer 6, joining member 7 is disposed like a frame around protective layer 27. As a result, a structure can be created that avoids entry of joining member 7 between the rear surface side of a central portion of light emitting plate 1 that exhibits the largest increase in temperature and coolant 4.

Figure 24:
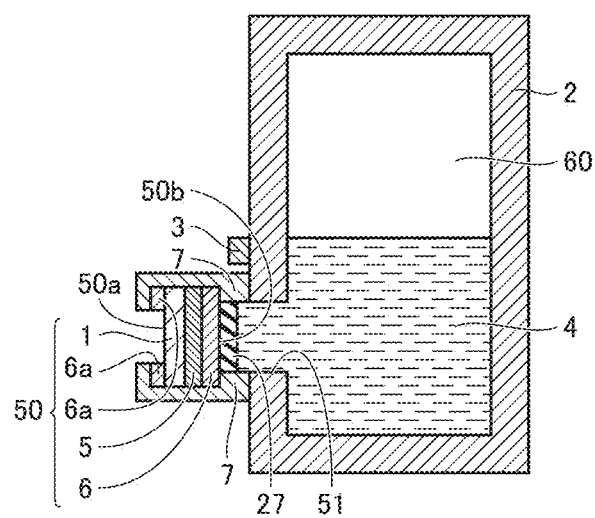
FIG. 24 is a schematic cross-sectional view of a light emitting apparatus according to a first modification of Embodiment 9 of the present invention.
Figure 25:
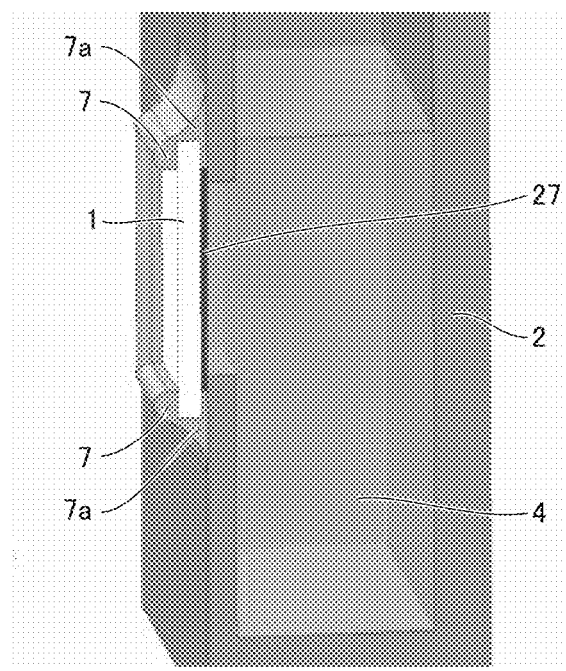
FIG. 25 is a schematic cross-sectional perspective view of a light emitting apparatus according to a second modification of Embodiment 9 of the present invention.
Figure 26:
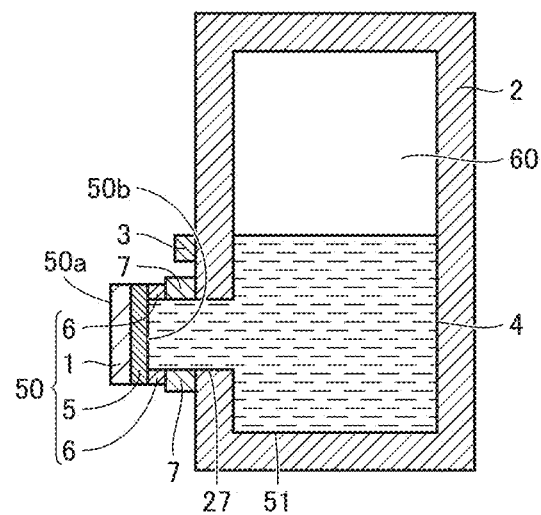
FIG. 26 is a schematic cross-sectional view of a light emitting apparatus according to a third modification of Embodiment 9 of the present invention.
Figure 27:
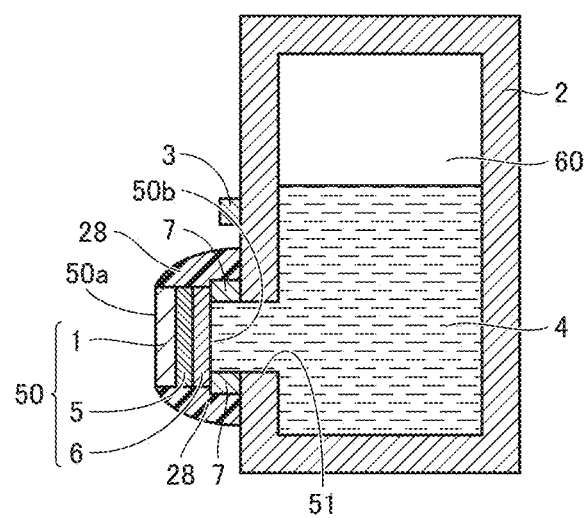
FIG. 27 is a schematic cross-sectional view of a light emitting apparatus according to a fourth modification of Embodiment 9 of the present invention.

FIGS. 24, 26 and 27 are schematic cross-sectional views of light emitting apparatuses according to first, third and fourth modifications of Embodiment 9 of the present invention, respectively. FIG. 25 is a schematic cross-sectional perspective view of a light emitting apparatus according to a second modification of Embodiment 9 of the present invention.

The light emitting apparatus shown in FIG. 24 basically has a similar configuration to the light emitting apparatus shown in FIG. 23, but is different from the light emitting apparatus shown in FIG. 23 in that a metal layer 6a is formed on the front surface side of light emitting plate 1, and that joining member 7 extends from the surface of metal layer 6 over an end face of light emitting member 50 onto the front surface of light emitting plate 1. In the light emitting apparatus shown in FIG. 24, metal layer 6a is disposed to cover an outer peripheral portion of the front surface of light emitting plate 1. Joining member 7 is formed to extend to a region over metal layer 6a. Such a configuration of joining member 7 can be formed by the following method, for example. That is, metal such as solder is used as a material for joining member 7, and this joining member 7 is heated and caused to flow so as to cover the end face of light emitting member 50. As a result, joining member 7 can wet and spread over the end face of light emitting member 50, and reach a portion over metal layer 6a, thereby providing the structure of joining member 7 shown in FIG. 24.

The light emitting apparatus having a configuration as described above can basically obtain similar effects to those of the light emitting apparatus shown in FIG. 23. Moreover, the periphery of light emitting plate 1 can be firmly secured by joining member 7. As a result, the reliability of the joining of light emitting plate 1 and coolant-sealed portion 2 can be improved.

The light emitting apparatus shown in FIG. 25 basically has a similar configuration to the light emitting apparatus shown in FIG. 24, but is different from the light emitting apparatus shown in FIG. 24 in the shape of the outer peripheral portion of joining member 7. Reflective layer 5 and metal layers 6, 6a are not shown in FIG. 25 since the thicknesses of reflective layer 5 and metal layers 6, 6a are relatively smaller than the thickness of light emitting plate 1. In the light emitting apparatus shown in FIG. 25, the thickness of an outer peripheral portion 7a of joining member 7 decreases as the distance from light emitting plate 1 increases. Stated from a different perspective, outer peripheral portion 7a of joining member 7 has a surface inclined relative to the surface of coolant-sealed portion 2. The surface of the outer peripheral portion of joining member 7 is curved to be recessed toward the surface of coolant-sealed portion 2. In the light emitting apparatus shown in FIG. 25, an outer peripheral end portion of protective layer 27 is in contact with joining member 7, and extends to a position overlapping with the surface of coolant-sealed portion 2.

The light emitting apparatus having a configuration as described above can basically obtain similar effects to those of the light emitting apparatus shown in FIG. 24. Moreover, the periphery of light emitting plate 1 can be more firmly secured by joining member 7.

The light emitting apparatus shown in FIG. 26 basically has a similar configuration to light emitting apparatus 100 shown in FIGS. 1 and 2, but is different from light emitting apparatus 100 shown in FIGS. 1 and 2 in the shape of metal layer 6. In the light emitting apparatus shown in FIG. 26, metal layer 6 is formed only on an outer peripheral portion of reflective layer 5. Stated from a different perspective, metal layer 6 is formed in the shape of a frame surrounding a central portion of the surface of reflective layer 5. In other words, light emitting member 50 includes metal layer 6 constituting second surface 50b and located only at an edge portion of second surface 50b. Joining member 7 joins metal layer 6 of light emitting member 50 to a region of the surface of coolant-sealed portion 2 as a housing that surrounds opening 51. The central portion of the surface of reflective layer 5 on which metal layer 6 is formed is exposed at the inner peripheral side of coolant-sealed portion 2 and is in contact with coolant 4.

The light emitting apparatus having a configuration as described above can basically obtain similar effects to those of light emitting apparatus 100 shown in FIGS. 1 and 2. Moreover, in the light emitting apparatus shown in FIG. 26, metal layer 6 is formed only on the outer peripheral portion of the surface of reflective layer 5. Thus, during the joining of joining member 7 to this metal layer 6, the spread of this joining member 7 to the central portion of the surface of reflective layer 5 can be suppressed. This is because the wettability of joining member 7 for the surface of reflective layer 5 is lower than the wettability of joining member 7 for metal layer 6.

The light emitting apparatus shown in FIG. 27 basically has a similar configuration to light emitting apparatus 100 shown in FIGS. 1 and 2, but is different from light emitting apparatus 100 shown in FIGS. 1 and 2 in that a protective resin 28 is formed as a protective member covering the end face of light emitting member 50. In the light emitting apparatus shown in FIG. 27, protective resin 28 covering the end face of light emitting member 50 and connected to the surface of coolant-sealed portion 2 is formed. Protective resin 28 has a surface inclined relative to the surface of coolant-sealed portion 2. The width of protective resin 28 in a direction along the surface of coolant-sealed portion 2 increases from the light emitting plate 1 side of light emitting member 50 toward the surface of coolant-sealed portion 2. Acrylic resin, silicone resin, urethane resin or the like can be used, for example, as a material for protective resin 28.

The light emitting apparatus having a configuration as described above can basically obtain similar effects to those of light emitting apparatus 100 shown in FIGS. 1 and 2. Moreover, in the light emitting apparatus shown in FIG. 27, joining member 7 can be reinforced with protective resin 28.

The structure around light emitting member 50 of each of the light emitting apparatuses according to the present embodiment shown in FIGS. 23 to 27 may be applied to the structure around light emitting member 50 of the light emitting apparatus according to any one of Embodiments 1 to 8.

Embodiment 10

<Configuration of Vehicle Headlamp>

Figure 28:
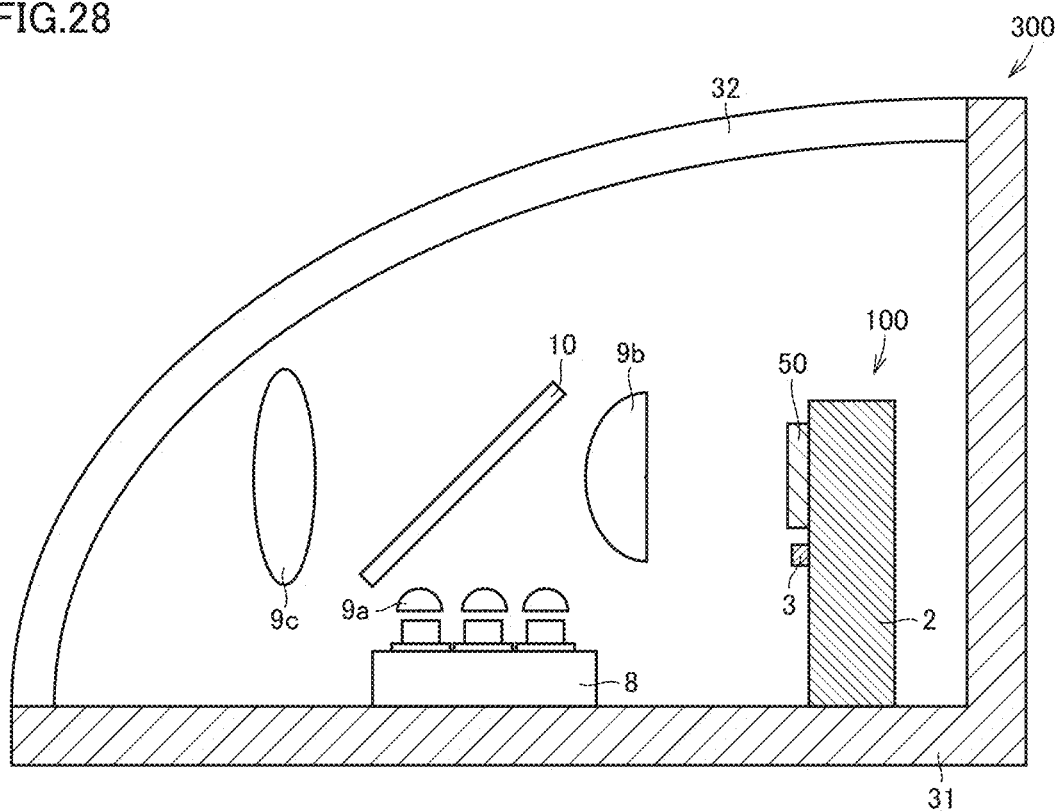
FIG. 28 is a schematic cross-sectional view of a vehicle headlamp according to Embodiment 10 of the present invention.

FIG. 28 is a schematic cross-sectional view of a vehicle headlamp according to Embodiment 10 of the present invention. A vehicle headlamp 300 shown in FIG. 28 mainly includes laser light source 8, lenses 9a to 9c, dichroic mirror 10, light emitting apparatus 100 described above, an illumination apparatus housing 31, and a transparent cover 32. Laser light source 8, lenses 9a to 9c, dichroic mirror 10 and light emitting apparatus 100 described above are similar in configuration to the electronic device shown in FIG. 3. In vehicle headlamp 300, each member described above is installed in illumination apparatus housing 31. Specifically, light emitting apparatus 100 and laser light source 8 are fixed on the same wall surface of illumination apparatus housing 31. Lenses 9b, 9c and dichroic mirror 10 are attached to illumination apparatus housing 31 via a support member which is not shown in the figure. Transparent cover 32 is connected to illumination apparatus housing 31 so as to cover laser light source 8, lenses 9a to 9c, dichroic mirror 10 and light emitting apparatus 100 that are fixed to illumination apparatus housing 31. Stated from a different perspective, vehicle headlamp 300 includes light emitting apparatus 100, and laser light source 8 as a light source for applying light to the first surface of light emitting member 50 in light emitting apparatus 100.

Although illumination apparatus housing 31 is L-shaped in cross section in FIG. 28, illumination apparatus housing 31 may have any shape. The light emitting apparatus of any one of Embodiments 1 to 9 can be applied to light emitting apparatus 100. Laser light source 8, lenses 9a to 9c, dichroic mirror 10 and light emitting apparatus 100 described above are disposed in a space enclosed by illumination apparatus housing 31 and transparent cover 32. The light from laser light source 8 is ultimately transmitted through transparent cover 32 from lens 9c and applied to the outside.

Any material can be used as a material for illumination apparatus housing 31. When a material having high thermal conductivity such as metal is used as the material for illumination apparatus housing 31, illumination apparatus housing 31 can function as a heat dissipation member for dissipating heat from light emitting apparatus 100 to the outside. Only a portion of illumination apparatus housing 31 that is connected to light emitting apparatus 100 may be made of a material having high thermal conductivity such as metal, and the other portions may be made of a material having relatively low thermal conductivity such as resin.

<Function and Effect of Vehicle Headlamp>

In vehicle headlamp 300 shown in FIG. 28, light emitting plate 1 is cooled by coolant 4, so that the area of laser light collected on light emitting plate 1 can be reduced. The area of laser light collection can be set, for example, at equal to or less than 1 mm$^2$. Accordingly, a light source having a smaller area of light emission than an LED light source of equal amount of light can be created. Therefore, the range of angles of light emitted forward from vehicle headlamp 300 can be narrowed. As a result, vehicle headlamp 300 emitting light that reaches farther than light from an LED light source of equal amount of light is obtained.

In the configuration shown in FIG. 28, in order to adjust the direction of light emission from vehicle headlamp 300, the angle of attachment of illumination apparatus housing 31 relative to the vehicle can be adjusted, for example. Depending on the application, however, vehicle headlamp 300 may be provided with a mechanism for adjusting the angle of at least one of lens 9c and dichroic mirror 10 relative to illumination apparatus housing 31. In this case, the direction of light emission can be adjusted by adjustment of the angle of at least one of lens 9c and dichroic mirror 10.

Embodiment 11

<Configuration as well as Function and Effect of Spotlight>

Figure 29:
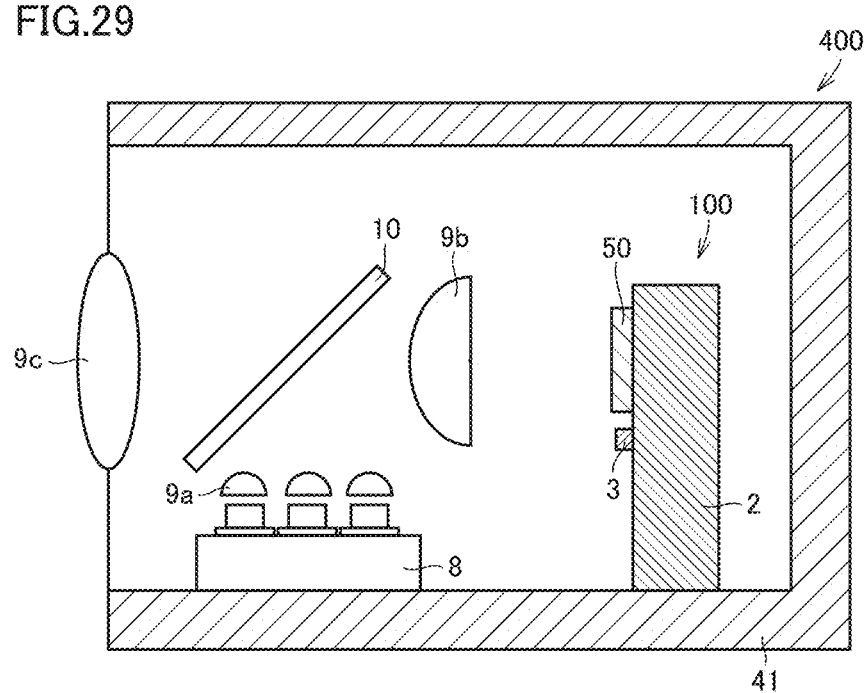
FIG. 29 is a schematic cross-sectional view of a spotlight according to Embodiment 11 of the present invention.

FIG. 29 is a schematic cross-sectional view of a spotlight as an example of an illumination apparatus according to Embodiment 11 of the present invention. A spotlight 400 shown in FIG. 29 mainly includes laser light source 8, lenses 9a to 9c, dichroic mirror 10, light emitting apparatus 100 described above, and an illumination apparatus housing 41. Laser light source 8, lenses 9a to 9c, dichroic mirror 10 and light emitting apparatus 100 described above are similar in configuration to the electronic device shown in FIG. 3. Each member described above is installed in illumination apparatus housing 41. Specifically, light emitting apparatus 100 and laser light source 8 are fixed on the same wall surface of illumination apparatus housing 41. Lenses 9b, 9c and dichroic mirror 10 are attached to illumination apparatus housing 41 via a support member which is not shown in the figure. Illumination apparatus housing 41 is shaped like a cup with an opening. Lens 9c is fixed to the opening. Stated from a different perspective, spotlight 400 includes light emitting apparatus 100, and laser light source 8 as a light source for applying light to the first surface of light emitting member 50 in light emitting apparatus 100.

In FIG. 29, the outer shape of illumination apparatus housing 41 may be any shape such as a cylindrical shape or prismatic shape. The light emitting apparatus of any one of Embodiments 1 to 9 can be applied to light emitting apparatus 100. As shown in FIG. 29, laser light source 8, lenses 9a, 9b, dichroic mirror 10 and light emitting apparatus 100 described above are disposed in a space enclosed by illumination apparatus housing 41 and lens 9c. The light from laser light source 8 is ultimately applied to the outside from lens 9c.

Although lens 9c is fixed to the opening in illumination apparatus housing 41 in FIG. 29, this opening may be covered with a transparent member. In this case, laser light source 8, lenses 9a to 9c, dichroic mirror 10 and light emitting apparatus 100 may be disposed in a region enclosed by this transparent member and illumination apparatus housing 41.

Any material can be used as a material for illumination apparatus housing 41. When metal is used as the material for illumination apparatus housing 41, for example, illumination apparatus housing 41 can function as a heat dissipation member for dissipating heat from light emitting apparatus 100 to the outside. Only a portion of illumination apparatus housing 41 that is connected to light emitting apparatus 100 may be made of a material having high thermal conductivity such as metal, and the other portions may be made of a material having relatively low thermal conductivity such as resin.

In spotlight 400 shown in FIG. 29, light emitting plate 1 is cooled by coolant 4, so that the area of laser light collected on light emitting plate 1 can be reduced, as with vehicle headlamp 300 shown in FIG. 28. Accordingly, a light source having a smaller area of light emission than an LED light source of equal amount of light can be created. Therefore, the range of angles of light emitted from spotlight 400 can be narrowed. As a result, spotlight 400 emitting light that reaches farther than light from an LED light source of equal amount of light is obtained.

It should be understood that the embodiments disclosed herein are illustrative and non-restrictive in every respect. The scope of the present invention is defined by the terms of the claims, not by the description of the embodiments above, and is intended to include any modifications within the meaning and scope equivalent to the terms of the claims.

REFERENCE SIGNS LIST

1 light emitting plate; 2 coolant-sealed portion; 2*a* upper surface; 2*b* lower surface; 3 temperature sensor; 4 coolant; 5 reflective layer; 6, 6*a* metal layer; 7 joining member; 7*a* outer peripheral portion; 8 laser light source; 9*a*, 9*b*, 9*c* lens; 10 dichroic mirror; 11, 12 path; 13 heat dissipating fin; 33 fin; 14 first heat dissipation member; 15 pump; 16 discharge portion; 17 suction portion; 18 axial fan; 19 thermoelectric element; 24, 25, 26 second heat dissipation member; 27 protective layer; 28 protective resin; 30 arrow; 31, 41 illumination apparatus housing; 32 transparent cover; 40 control unit; 50 light emitting member; 50*a* first surface, third surface; 50*b* second surface, fourth surface; 51 opening; 51*a* inner peripheral side surface; 60 holding portion; 100 light emitting apparatus; 110 display output unit; 120 power supply; 130 input/output unit; 200 electronic device; 300 vehicle headlamp; 400 spotlight.

The invention claimed is:

1. A light emitting apparatus comprising:
   a light emitting member including a first surface and a second surface, the first surface including a phosphor irradiated with light to emit light and the second surface being different from the first surface;
   a refrigerant for cooling the light emitting member; and
   a housing including a holding portion for holding the refrigerant,
   a surface of the housing being provided with an opening communicating with the holding portion,
   the light emitting member being connected to the housing such that the second surface closes the opening.

2. The light emitting apparatus according to claim 1, wherein
   the light emitting member includes a metal layer constituting the second surface, and
   the light emitting apparatus further comprises a joining member for joining a portion of the metal layer of the light emitting member to a region of the surface of the housing that surrounds the opening.

3. The light emitting apparatus according to claim 1, wherein
   the light emitting member includes a metal layer constituting the second surface and located only at an edge portion of the second surface, and
   the light emitting apparatus further comprises a joining member for joining the metal layer of the light emitting member to a region of the surface of the housing that surrounds the opening.

4. The light emitting apparatus according to claim 1, wherein
   the refrigerant is disposed within the holding portion so as to cover the opening and to reach a region located higher than the opening in a direction of gravity in the holding portion.

5. The light emitting apparatus according to claim 1, comprising a temperature sensor mounted on the housing.

6. The light emitting apparatus according to claim 1, comprising a first heat dissipation member connected to the second surface and protruding into the holding portion through the opening to be in contact with the refrigerant, and
   the first heat dissipation member includes a first protrusion-recess structure portion located within the holding portion.

7. The light emitting apparatus according to claim 1, comprising a second heat dissipation member connected to an inner wall surface of the holding portion, and
   the second heat dissipation member includes a second protrusion-recess structure portion.

8. The light emitting apparatus according to claim 1, wherein
   the holding portion includes a circulation channel allowing the refrigerant to flow therethrough.

9. The light emitting apparatus according to claim 8, comprising at least one other light emitting member including a third surface and a fourth surface, the third surface including a phosphor irradiated with light to emit light and the fourth surface being different from the third surface,
   the surface of the housing is provided with at least one other opening communicating with the holding portion,
   the at least one other light emitting member is connected to the housing such that the fourth surface closes the at least one other opening, and
   the circulation channel is formed to connect the opening and the at least one other opening in series.

10. The light emitting apparatus according to claim 8, comprising at least one other light emitting member including a third surface and a fourth surface, the third surface including a phosphor irradiated with light to emit light and the fourth surface being different from the third surface,
    the surface of the housing is provided with at least one other opening communicating with the holding portion,
    the at least one other light emitting member is connected to the housing such that the fourth surface closes the at least one other opening, and
    the circulation channel is formed to connect the opening and the at least one other opening in parallel.

11. The light emitting apparatus according to claim 1, further comprising a driving member for causing the refrigerant to flow toward the opening within the holding portion.

12. The light emitting apparatus according to claim 1, wherein
    the housing has an upper surface and a lower surface located opposite to the upper surface in the direction of gravity,
    the lower surface of the housing is provided with the opening, and
    the light emitting apparatus further comprises a blower fan disposed on the upper surface of the housing.

13. The light emitting apparatus according to claim 1, wherein
    the housing has an upper surface and a lower surface located opposite to the upper surface in the direction of gravity,
    the lower surface of the housing is provided with the opening, and
    an inner peripheral side surface of the opening is inclined relative to the direction of gravity such that the width of the opening increases toward the upper surface.

14. The light emitting apparatus according to claim 1, wherein the housing is configured to rotate around a rotational axis, and the first surface of the light emitting member includes a portion not overlapping with the rotational axis.

15. The light emitting apparatus according to claim 1, comprising a thermoelectric element connected to the housing.

16. The light emitting apparatus according to claim 1, comprising a protective layer formed on the second surface of the light emitting member.

17. An electronic device comprising:

the light emitting apparatus according to claim 1; and a light source for applying light to the first surface of the light emitting member in the light emitting apparatus.

18. A vehicle headlamp comprising:

the light emitting apparatus according to claim 1; and a light source for applying light to the first surface of the light emitting member in the light emitting apparatus.

19. An illumination apparatus comprising:

the light emitting apparatus according to claim 1; and a light source for applying light to the first surface of the light emitting member in the light emitting apparatus.

* * * * *